(12) United States Patent
Shishido et al.

(10) Patent No.: US 9,726,972 B2
(45) Date of Patent: Aug. 8, 2017

(54) MASK BLANK, TRANSFER MASK, AND METHOD FOR MANUFACTURING TRANSFER MASK

(71) Applicant: HOYA CORPORATION, Tokyo (JP)

(72) Inventors: Hiroaki Shishido, Tokyo (JP); Ryo Ohkubo, Tokyo (JP); Osamu Nozawa, Tokyo (JP)

(73) Assignee: HOYA CORPORATION, Shinjuku-ku, Tokyo (JP)

( * ) Notice: Subject to any disclaimer, the term of this patent is extended or adjusted under 35 U.S.C. 154(b) by 14 days.

(21) Appl. No.: 14/904,452

(22) PCT Filed: Aug. 15, 2014

(86) PCT No.: PCT/JP2014/071487
§ 371 (c)(1),
(2) Date: Jan. 12, 2016

(87) PCT Pub. No.: WO2015/037392
PCT Pub. Date: Mar. 19, 2015

(65) Prior Publication Data
US 2016/0202603 A1 Jul. 14, 2016

(30) Foreign Application Priority Data

Sep. 10, 2013 (JP) ................... 2013-187317

(51) Int. Cl.
*G03F 1/32* (2012.01)
*G03F 1/80* (2012.01)
(Continued)

(52) U.S. Cl.
CPC .................. *G03F 1/80* (2013.01); *G03F 1/32* (2013.01); *G03F 1/58* (2013.01); *H01L 21/027* (2013.01); *C23F 4/00* (2013.01)

(58) Field of Classification Search
None
See application file for complete search history.

(56) References Cited

U.S. PATENT DOCUMENTS 6,764,792 B1 7/2004 Fujikawa et al.
2002/0039689 A1 4/2002 Yusa et al.
(Continued)

FOREIGN PATENT DOCUMENTS

JP 2001-83687 A 3/2001
JP 2001-312043 A 11/2001
(Continued)

OTHER PUBLICATIONS

International Search Report of PCT/JP2014/071487 dated Nov. 18, 2014. [PCT/ISA/210].

*Primary Examiner* — Stephen Rosasco
(74) *Attorney, Agent, or Firm* — Sughrue Mion, PLLC

(57) ABSTRACT

A mask blank wherein damage to a light semitransmissive film due to dry etching for removing a light shielding film is inhibited. Mask blank 100 has a light semitransmissive film 2 and light shielding film 4 laminated on a main surface of a transparent substrate 1. Film 2 can be dry etched with a fluorine-based gas. Film 4 has laminated lower layer 41 and upper layer 42. Lower layer 41 contained tantalum and id substantially free from hafnium, zirconium, and oxygen. Upper layer 42 contains tantalum and one or more of hafnium and zirconium and is substantially free from oxygen excluding the surface layer of the upper layer 42. Between the light semitransmissive film 2 and lower layer 41 is an etching stopper film 3 having etch selectivity with respect to the lower layer 41 in dry etching with an etching gas containing the chlorine-based gas and no oxygen gas.

21 Claims, 4 Drawing Sheets

(51) Int. Cl.
*G03F 1/58* (2012.01)
*H01L 21/027* (2006.01)
*C23F 4/00* (2006.01)

(56) References Cited

U.S. PATENT DOCUMENTS

| | | |
|---|---|---|
| 2003/0180631 A1* | 9/2003 | Shiota ........................ G03F 1/32 430/5 |
| 2006/0177746 A1 | 8/2006 | Yoshikawa et al. |
| 2007/0020534 A1 | 1/2007 | Yoshikawa et al. |
| 2007/0212618 A1 | 9/2007 | Yoshikawa et al. |
| 2007/0248897 A1 | 10/2007 | Yoshikawa et al. |
| 2009/0246645 A1 | 10/2009 | Nozawa |
| 2010/0075236 A1 | 3/2010 | Hashimoto et al. |

FOREIGN PATENT DOCUMENTS

| | | |
|---|---|---|
| JP | 2006-215297 A | 8/2006 |
| JP | 2007-33469 A | 2/2007 |
| JP | 2007-241065 A | 9/2007 |
| JP | 2007-292824 A | 11/2007 |
| JP | 2008-249949 A | 10/2008 |
| JP | 2009-244793 A | 10/2009 |
| JP | 2010-72406 A | 4/2010 |

* cited by examiner

[Fig. 1]
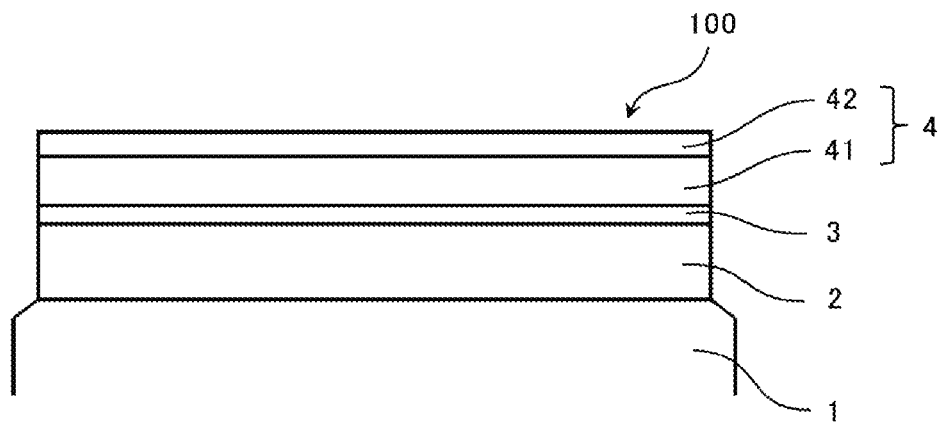
[Fig. 2]
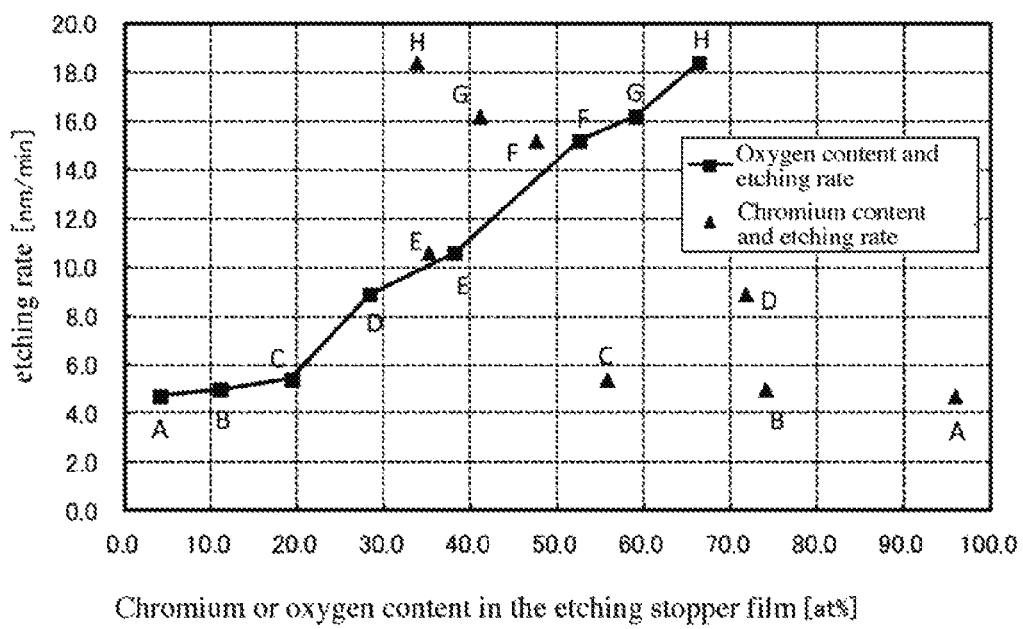

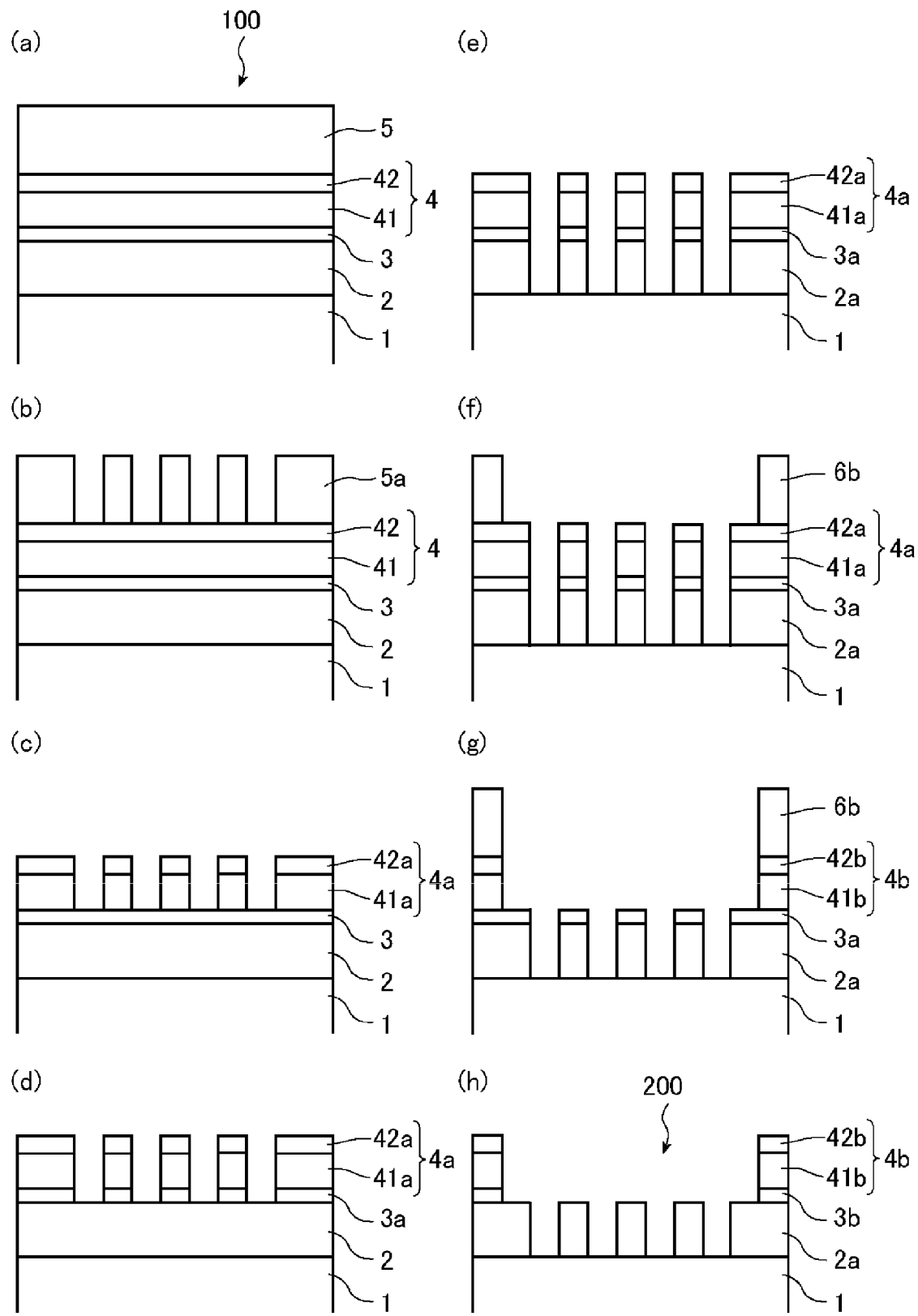
[Fig. 3]

[Fig. 4]
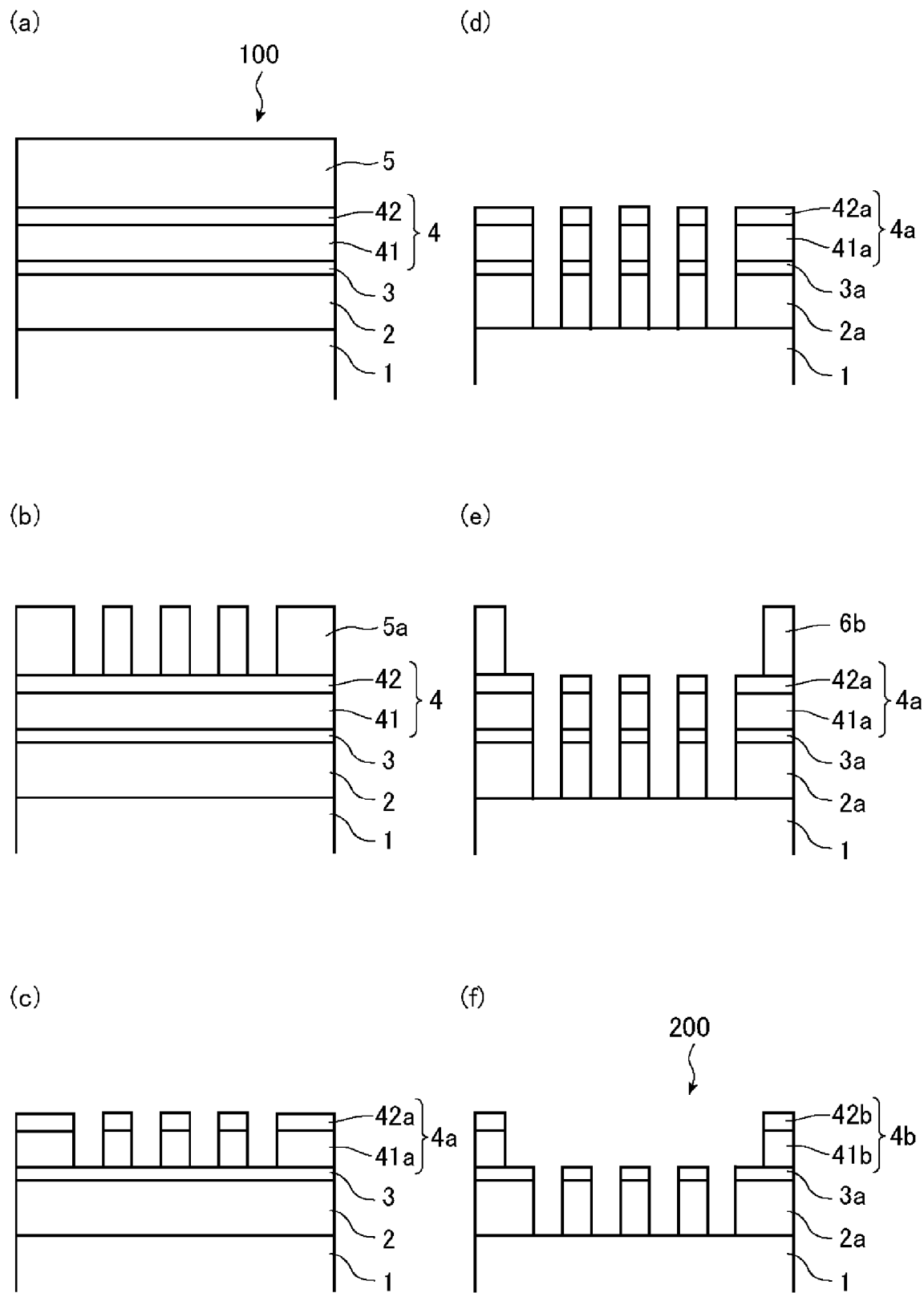

[Fig. 5]
(a)
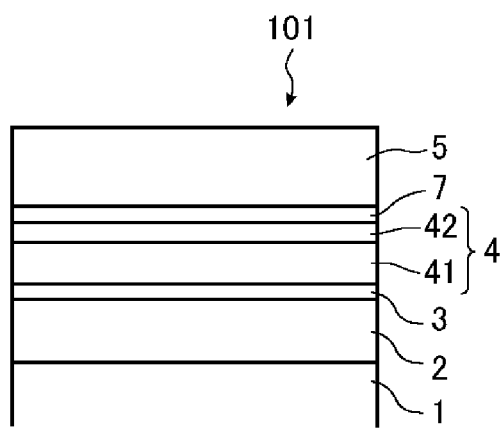
(b)
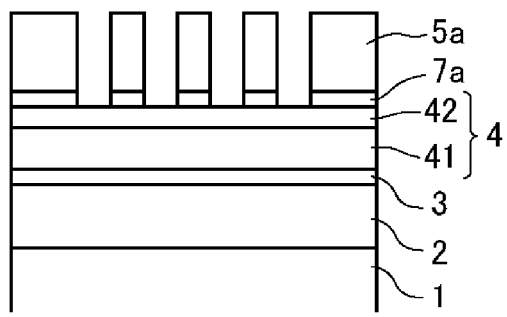
(c)
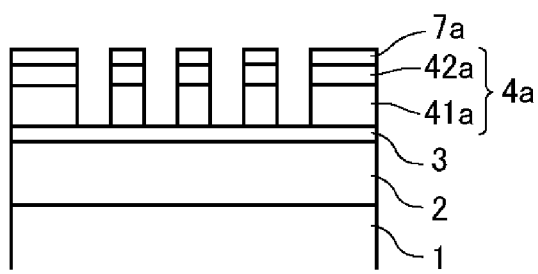
(d)
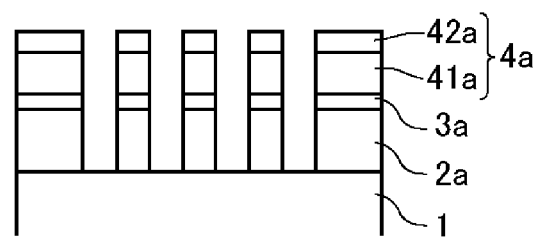
(e)
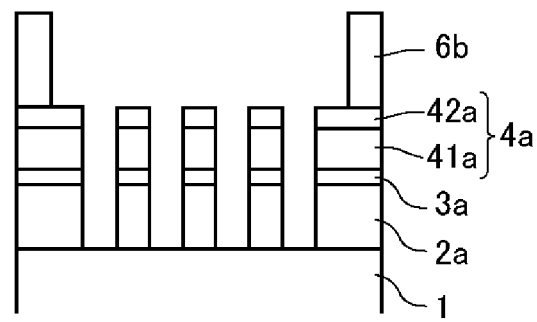
(f)
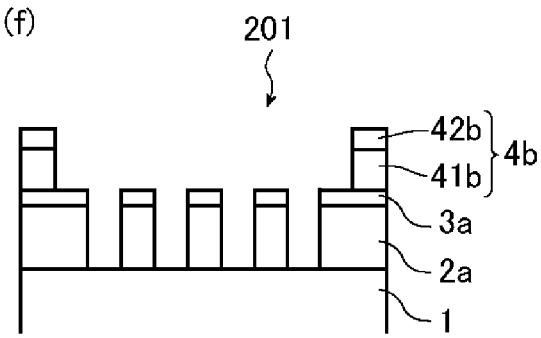

MASK BLANK, TRANSFER MASK, AND METHOD FOR MANUFACTURING TRANSFER MASK

CROSS REFERENCE TO RELATED APPLICATIONS

This application is a National Stage of International Application No. PCT/JP2014/071487 filed Aug. 15, 2014, claiming priority based on Japanese Patent Application No. 2013-187317, filed Sep. 10, 2013, the contents of all of which are incorporated herein by reference in their entirety.

TECHNICAL FIELD

The present invention relates to a mask blank, a transfer mask, and a method for manufacturing the transfer mask.

In a manufacturing process of a semiconductor device, a fine pattern is generally formed using a photolithographic method. In the formation of the fine pattern, multiple substrates, which are referred to as transfer masks, are usually used. The transfer mask is formed by providing the fine pattern comprised of a metal thin film, etc. on a generally transparent glass substrate. The photolithographic method is also used in the manufacture of the transfer mask.

Refinement of a pattern for the semiconductor device requires the refinement of a mask pattern formed in the transfer mask as well as shortening of a wavelength of an exposure light source used in photolithography. Recently, the exposure light sources used in the manufacture of semiconductor devices are shifting from KrF excimer lasers (wavelength: 248 nm) to ArF excimer lasers (wavelength: 193 nm), that is, shorter wavelength light sources are increasingly used.

The known types of transfer masks include a binary mask including a light shielding pattern made of a chromium-based material on a conventional transparent substrate, as well as a half tone phase shift mask. The half tone phase shift mask comprises a light semitransmissive pattern on the transparent substrate. The light semitransmissive film (half tone phase shift film) has functions for allowing transmission of light at an intensity not substantially contributing to the light exposure and for providing the light transmitted through the light semitransmissive film with a predetermined phase difference with respect to light traveling the same distance through air, thereby generating a so-called phase shift effect.

Generally, in the transfer mask, a periphery region outside the region in which a transfer pattern is formed should ensure optical density (OD) not less than a predetermined value such that, upon the exposure transfer to a resist film on a semiconductor wafer using a light exposure device, the resist film will not be affected by the exposure light transmitted through the periphery region. Usually, in the periphery region of the transfer mask, OD is desirably 3 or more, and at least about 2.8 of OD is required. However, the light semitransmissive film of the half tone phase shift mask has a function for allowing the transmission of the exposure light at a predetermined transmittance, and thus, it is difficult to ensure the optical density required for the periphery region of the transfer mask by this light semitransmissive film alone. Therefore, as with the phase shift mask blank disclosed in Patent Document 1, a light shielding film (light blocking film) is laminated on a semitransparent film having predetermined phase shift amount and transmittance with respect to the exposure light, so that a laminated structure of the semitransparent film and light shielding film ensures the predetermined optical density.

On the other hand, there is a photomask blank as disclosed in Patent Document 2. A semitransparent laminated film of the photomask blank is formed by laminating a phase progression film having a property that a phase of exposure light transmitted therethrough progresses much more than that of exposure light traveling the same distance through air and a phase delay film having a property that, in contrast, a phase of exposure light transmitted therethrough delays. With this configuration, the exposure light transmitted through the semitransparent laminated film will not have a phase difference with respect to the exposure light traveling the same distance through air. It is also difficult for the semitransparent laminated film having such a property to ensure the optical density required for the periphery region of the transfer mask by itself. Therefore, the photomask blank disclosed in Patent Document 2 also comprises the light shielding film laminated on the semitransparent laminated film in order for a laminated structure of the semitransparent laminated film and light shielding film to ensure the predetermined optical density.

PRIOR ART DOCUMENTS

Patent Documents

Patent Document 1: Japanese Patent Application Publication 2007-033469
Patent Document 2: Japanese Patent Application Publication 2006-215297

SUMMARY OF THE INVENTION

Problems to be Solved by the Invention

The transfer mask comprising the transfer pattern formed by a thin film (light semitransmissive film) allowing the transmission of the exposure light at the predetermined transmittance as disclosed in Patent Documents 1 and 2 is fabricated using the mask blank comprising the light shielding film laminated on the light semitransmissive film. In the transfer mask fabricated from this mask blank, only a pattern of the light semitransmissive film exists in a region on a substrate where the transfer pattern is formed, exclusive of a particular region where a light shielding patch, etc. should be formed. On the other hand, in the periphery region (blind area) where the predetermined optical density is required, a layer in which the light semitransmissive film and light shielding film are laminated (light shielding band) exists. It is necessary to fabricate the transfer mask having this configuration. Thus, in a structure wherein the light semitransmissive film and light shielding film are laminated without any other films therebetween, the light semitransmissive film and the light shielding film should be formed from materials having etching properties different from each other.

The procedure for fabricating the transfer mask from the above mask blank is as follows. First, a first resist pattern having a pattern to be formed in the light semitransmissive film is provided on the light shielding film. Then, using the first resist pattern as a mask, the light shielding film is etched to form the pattern. Next, the first resist pattern is removed. Then, using the pattern of the light shielding film as a mask, the light semitransmissive film is etched to form a light semitransmissive pattern. After that, a second resist pattern having a pattern to be formed in the light shielding film is provided on the light shielding film. Next, using the second resist pattern as a mask, the light shielding film is etched to form a light shielding pattern (light shielding band). Finally, the second resist pattern is removed, and a predetermined cleaning process is performed, such that the transfer mask is finished.

The pattern to be formed in the light semitransmissive film is a very fine pattern since it is to be transferred to the resist film on the semiconductor wafer by exposure. However, since the light shielding film is laminated on the light semitransmissive film in the mask blank, the pattern to be formed in the light semitransmissive film should be temporarily formed in the light shielding film. As mentioned above, the light semitransmissive film is often provided with a function other than the transmission of the exposure light at the predetermined transmittance. In order to provide the light semitransmissive film with this property, a material containing silicon, or a material containing silicon and transition metal is often used. If the fine pattern is formed in the light semitransmissive film made of the above material, patterning by dry etching with an etching gas containing a fluorine-based gas is desirable.

In order to achieve the process for fabricating the above transfer mask on the premise that the light semitransmissive film is patterned by the dry etching with the etching gas containing the fluorine-based gas, a material for the light shielding film should have a tolerance to the dry etching with the etching gas containing the fluorine-based gas. Additionally, it is necessary that the fine pattern to be formed in the light semitransmissive film may be formed in the light shielding film with an etching gas other than the fluorine-based gas. As mentioned above, the light shielding film immediately above the region where the light semitransmissive pattern is formed, exclusive of the particular region where the light shielding patch, etc. should be formed, is completely removed. Thus, the light semitransmissive film desirably has sufficient etch selectivity with respect to an etching gas used in the dry etching for removing the light shielding film. A material for the light shielding film satisfying all these conditions together includes a chromium-containing material, which has been used for a long time. An etching gas used for forming the fine pattern in the light shielding film made of the chromium-containing material is a mixed gas of a chlorine-based gas and an oxygen gas.

However, the commonly-used resist film formed from an organic material has a tolerance to plasma of the oxygen gas significantly lower than the tolerance to plasma of other gases. Thus, if the light shielding film made from a chromium-based material is dry etched with the mixed gas of the chlorine-based gas and oxygen gas, an amount of consumption of the resist film (a reduction amount of the thickness of the resist film during the etching) is increased. In order to form the fine pattern in the light shielding film with great accuracy by the dry etching, the resist film having a predetermined thickness or more should be left upon completion of the patterning of the light shielding film. However, if the film thickness of the resist film in which the pattern is initially formed is increased, a cross-sectional aspect ratio of the resist pattern (a ratio of a pattern line width to the film thickness) becomes too large, and thus, a phenomenon of resist pattern collapse tends to take place.

There is a material other than the chromium-based material which has a tolerance to the etching gas containing the fluorine-based gas. For example, a thin film formed from a material such as tantalum-hafnium alloy, tantalum-zirconium alloy, tantalum-hafnium-zirconium alloy, etc. (hereinafter referred to as "tantalum-hafnium alloy, etc.") has a tolerance to the dry etching with the etching gas containing the fluorine-based gas, and may be patterned by the dry etching with the chlorine-based gas containing no oxygen. The material containing silicon or the material containing silicon and transition metal for forming the light semitransmissive film is relatively tolerant of the dry etching with the chlorine-based gas containing no oxygen. However, the material such as tantalum-hafnium alloy or tantalum-zirconium alloy, etc. is easily oxidized, which gives rise to a problem that an etching rate in the dry etching with the chlorine-based gas containing no oxygen is significantly reduced when the oxidation progresses.

When the mask blank is fabricated to comprise the light shielding film formed from the material such as tantalum-hafnium alloy, etc. laminated on the light semitransmissive film without any other films therebetween, at the step for forming in the light shielding film a pattern to be formed in the light semitransmissive film, the oxidation of the light shielding film has not progressed relatively, and thus, the dry etching with the chlorine-based gas containing no oxygen may allow sufficient patterning. However, at the step for removing the light shielding film on the light semitransmissive pattern, the oxidation of the light shielding film has progressed, and the etching rate with respect to the dry etching of the light shielding film with the chlorine-based gas containing no oxygen is significantly reduced. In order to remove the light shielding film made of the material such as tantalum-hafnium alloy, etc., in which the oxidation has progressed, the dry etching with the chlorine-based gas with applied bias being higher than usual is effective. However, this high-bias dry etching has a great physical effect. Therefore, there is a problem that damage may be caused to a surface layer of the light semitransmissive pattern exposed upon removal of the light shielding film. If the light semitransmissive film is a phase shift film which not only has a function for allowing the transmission of the exposure light at the predetermined transmittance, but also a function for providing the exposure light transmitted through the light semitransmissive film with a predetermined phase difference from the exposure light traveling through air for the same distance as the thickness of the light semitransmissive film, the damage caused to the surface layer has a particularly profound effect.

One means for solving these problems is to provide an etching stopper film made of a chromium-containing material between the light semitransmissive film and light shielding film. In order to provide the etching stopper film, after a pattern to be formed in the light semitransmissive film is formed in the light shielding film made of the material such as tantalum-hafnium alloy, etc., a dry etching process is performed for forming in the etching stopper film the pattern to be formed in the light semitransmissive film using the light shielding film as a mask. An etching gas used in the dry etching for the etching stopper film is the mixed gas of the chlorine-based gas and oxygen gas. During the dry etching, a surface of the light shielding film is exposed to plasma of the oxygen gas. Thus, the oxidation in the material such as tantalum-hafnium alloy, etc. for forming the light shielding film inevitably progresses much more than the configuration having no etching stopper film made of the chromium-containing material.

The dry etching for removing the light shielding film made of the material such as tantalum-hafnium alloy, etc., in which the oxidation has progressed considerably, should be performed under a high bias condition. However, if a pattern is formed in the light semitransmissive film at this stage, an exposed portion of a surface of a transparent substrate, which is a transparent part, is exposed to the high-bias etching, and thus, the surface of the substrate may be etched.

A material applicable to the etching stopper film provided between the light semitransmissive film and light shielding film includes a material containing silicon and oxygen. Regarding this etching stopper film, the etching stopper film in a region where the light shielding film is removed upon finishing the transfer mask is not removed, but left. In this etching stopper film, when the high-bias dry etching is performed for removing the light shielding film made of the material such as tantalum-hafnium alloy, etc., in which the oxidation has progressed considerably, the etching stopper film may also be etched. The etching stopper film in this case forms a laminated structure together with the light semitransmissive film to act as a light semitransmissive pattern. Thus, if the etching stopper film is etched, a desired optical property may not be obtained from the pattern of the laminated structure of the light semitransmissive film and etching stopper film.

The present invention was made to solve the existing problems. It is an object of the present invention to provide a mask blank comprising a light shielding film laminated on a light semitransmissive film, wherein a fine pattern may be formed in the light semitransmissive film with great accuracy, and wherein damage to surfaces of the light semitransmissive film and transparent substrate, caused by dry etching for removing the light shielding film on the pattern of the light semitransmissive film, may be restrained. It is also an object of the present invention to provide a transfer mask manufactured using this mask blank and a method of manufacturing the transfer mask.

Means of Solving the Problems

The inventors came up with the present invention as a result of the earnest study for solving the above problems. In order to solve the above problems, the present invention comprises the following configurations.

(Configuration 1)
A mask blank having a structure in which a light semitransmissive film and a light shielding film are laminated on a main surface of a transparent substrate,
wherein the light semitransmissive film is formed from a material which can be dry etched with an etching gas containing a fluorine-based gas,
wherein the light shielding film at least includes a laminated structure of a lower layer and an upper layer,
wherein the lower layer is formed from a material containing tantalum and substantially free from hafnium, zirconium, and oxygen,
wherein the upper layer is formed from a material containing tantalum and one or more elements selected from hafnium and zirconium, and substantially free from oxygen excluding a surface layer thereof, and
wherein an etching stopper film provided between the light semitransmissive film and the lower layer is made of a material having etch selectivity with respect to the lower layer in dry etching with an etching gas containing a chlorine-based gas and no oxygen gas.

(Configuration 2)
The mask blank according to Configuration 1, wherein the upper layer is formed from a material which can be dry etched with the etching gas containing the chlorine-based gas and no oxygen gas and which has etch selectivity with respect to the light semitransmissive film in the dry etching with the etching gas containing the fluorine-based gas.

(Configuration 3)
The mask blank according to Configuration 1 or 2, wherein the lower layer is formed from a material which can be dry etched with the etching gas containing the chlorine-based gas and no oxygen gas and which can be dry etched with the etching gas containing the fluorine-based gas.

(Configuration 4)
The mask blank according to any one of Configurations 1 to 3, wherein the lower layer is made of a nitrogen-containing material.

(Configuration 5)
The mask blank according to any one of Configurations 1 to 4, wherein the upper layer is made of a material not containing any non-metal element, except for its surface layer.

(Configuration 6)
The mask blank according to any one of Configurations 1 to 5, wherein the light semitransmissive film is made of a material containing silicon and nitrogen.

(Configuration 7)
The mask blank according to any one of Configurations 1 to 6, wherein the light shielding film comprises an uppermost layer in contact with a surface layer of the upper layer, and
wherein the uppermost layer is formed from a material containing tantalum and substantially free from hafnium and zirconium.

(Configuration 8)
The mask blank according to Configuration 7, wherein the uppermost layer is made of a nitrogen-containing material.

(Configuration 9)
The mask blank according to any one of Configurations 1 to 8, wherein a resist film made of an organic material is provided adjacent to a surface of the light shielding film.

(Configuration 10)
The mask blank according to any one of Configurations 1 to 9, wherein the lower layer has a thickness greater than a thickness of the upper layer.

(Configuration 11)
The mask blank according to any one of Configurations 1 to 10, wherein the etching stopper film is made of a chromium-containing material.

(Configuration 12)
The mask blank according to Configuration 11, wherein the etching stopper film is formed from a material having an oxygen content of 20 at % or less.

(Configuration 13)
The mask blank according to Configuration 11 or 12, wherein the etching stopper film is formed from a material having a chromium content of 55 at % or more.

(Configuration 14)
The mask blank according to any one of Configurations 11 to 13, wherein the etching stopper film has a thickness of 3 nm to 10 nm inclusive.

(Configuration 15)
The mask blank according to any one of Configurations 11 to 14, wherein in a laminated structure of the light semitransmissive film, the etching stopper film, and the light shielding film, optical density with respect to exposure light is 2.8 or more.

(Configuration 16)
The mask blank according to any one of Configurations 1 to 10, wherein the etching stopper film is made of a material containing silicon and oxygen.

(Configuration 17)
A transfer mask, wherein a light semitransmissive pattern is formed in the light semitransmissive film of the mask blank according to any one of Configurations 1 to 15, and light shielding band patterns are formed in the etching stopper film and the light shielding film.
(Configuration 18)
A transfer mask, wherein light semitransmissive patterns are formed in the light semitransmissive film and the etching stopper film of the mask blank according to Configuration 16, and a light shielding band pattern is formed in the light shielding film.
(Configuration 19)
A method for manufacturing a transfer mask using the mask blank according to any one of Configurations 11 to 15, comprising the steps of:
forming a light semitransmissive pattern in the light shielding film by dry etching with an etching gas containing a chlorine-based gas and no oxygen gas, using as a mask a first resist film having a transfer pattern formed on the light shielding film;
forming the light semitransmissive pattern in the etching stopper film by dry etching with an etching gas containing the chlorine-based gas and oxygen gas, using as a mask the light shielding film or the first resist film having the light semitransmissive pattern;
forming the light semitransmissive pattern in the light semitransmissive film by dry etching with an etching gas containing a fluorine-based gas, using as a mask the etching stopper film or the light shielding film having the light semitransmissive pattern;
forming a light shielding band pattern in the light shielding film by dry etching with an etching gas containing the chlorine-based gas and no oxygen gas, using as a mask a second resist film having the light shielding band pattern formed on the light shielding film; and
forming the light shielding band pattern in the etching stopper film by dry etching with an etching gas containing the chlorine-based gas and oxygen gas, using as a mask the light shielding film or the second resist film having the light shielding band pattern formed on the light shielding film.
(Configuration 20)
A method for manufacturing a transfer mask using the mask blank according to Configuration 16, comprising the steps of:
forming a light semitransmissive pattern in the light shielding film by dry etching with an etching gas containing the chlorine-based gas and no oxygen gas, using as a mask a first resist film having a transfer pattern formed on the light shielding film;
forming the light semitransmissive patterns in the etching stopper film and the light semitransmissive film by dry etching with an etching gas containing a fluorine-based gas, using as a mask the light shielding film or the first resist film having the light semitransmissive pattern; and
forming a light shielding band pattern in the light shielding film by dry etching with an etching gas containing the chlorine-based gas and no oxygen gas, using as a mask a second resist film having the light shielding band pattern formed on the light shielding film.
(Configuration 21)
The method for manufacturing the transfer mask according to Configuration 19 or 20, wherein the dry etching for forming the light shielding band pattern at least in an upper layer of the light shielding film is performed in a high-bias state relative to the dry etching for forming the light semitransmissive pattern in the light shielding film.

Effect of the Invention

According to the present invention, in a mask blank having a laminated structure of a light semitransmissive film, an etching stopper film, and a light shielding film, the light shielding film is configured to at least comprise a laminated structure of a lower layer formed from a material containing tantalum and substantially free from hafnium, zirconium, and oxygen, and an upper layer formed from a material containing tantalum and one or more elements selected from hafnium and zirconium, and free from oxygen excluding a surface layer thereof, thereby eliminating the risk of disappearance of the etching stopper film upon removal of the light shielding film on the etching stopper film by dry etching, and restraining the damage to the surface layer of the light semitransmissive film.

BRIEF DESCRIPTION OF THE DRAWINGS

FIG. 1 is a cross-sectional view showing a layered configuration of a mask blank of the present invention.
FIG. 2 is a graph showing a relationship between chromium and oxygen contents in an etching stopper film and an etching rate with respect to a chlorine-based gas.
FIGS. 3(a)-(h) are cross-sectional views showing a manufacturing process of a transfer mask according to a first embodiment of the present invention.
FIGS. 4(a)-(f) are cross-sectional views showing a manufacturing process of a transfer mask according to a second embodiment of the present invention.
FIGS. 5(a)-(f) are cross-sectional views showing a manufacturing process of a transfer mask according to a third embodiment of the present invention.

BEST MODE FOR CARRYING OUT THE INVENTION

The first embodiment of the present invention is described below in detail.
The first embodiment of the present invention is a mask blank having a structure in which a light semitransmissive film and a light shielding film are laminated on a main surface of a transparent substrate. Specifically, as described in Configuration 1 above, it is characterized in that the light semitransmissive film is formed from a material which can be dry etched with an etching gas containing a fluorine-based gas, the light shielding film at least includes a laminated structure of a lower layer and an upper layer, the lower layer is formed from a material containing tantalum and substantially free from hafnium, zirconium, and oxygen, the upper layer is formed from a material containing tantalum and one or more elements selected from hafnium and zirconium, and substantially free from oxygen excluding a surface layer thereof, and provided between the light semitransmissive film and the lower layer is an etching stopper film, which is made of a material having etch selectivity with respect to the lower layer in dry etching with an etching gas containing a chlorine-based gas and no oxygen gas.
As mentioned above, in the mask blank having a laminated structure in which the light shielding film formed from a material such as tantalum-hafnium alloy, etc. is provided on the light semitransmissive film without any other films therebetween, patterning of the light shielding film in which oxidation of the material has progressed requires the use of high-bias dry etching with a chlorine-based gas containing no oxygen gas. However, this high-bias dry etching may lead to etching of the surface layer of the light semitransmissive film.
It is envisioned that an etching stopper film having an etching tolerance to the chlorine-based gas containing no oxygen gas is provided between the light semitransmissive film and the light shielding film, so as to reach a solution. However, if dry etching of the entire light shielding film in a thickness direction is high-bias dry etching, it is difficult to avoid creation of a region where the etching stopper film is exposed, because of the light shielding film entirely etched first due to a difference in density between in-plane patterns. The region where the etching stopper film is exposed first is exposed to the high-bias dry etching until etching of other regions where the light shielding film remains is completed. This may lead to local disappearance of the etching stopper film.

In the first embodiment of the present invention, the light shielding film is configured to at least comprise a laminated structure of an upper layer and a lower layer which are formed from different materials. The upper layer is formed from a material containing tantalum and one or more elements selected from hafnium and zirconium, and substantially free from oxygen excluding a surface layer of the upper layer. The upper layer made of such a material has a high tolerance to the dry etching with the fluorine-based gas, and is patterned by the dry etching with the chlorine-based gas. However, when the oxidation in the upper layer is progressed, it is difficult to pattern the upper layer by the dry etching with the chlorine-based gas containing no oxygen gas, and thus, the high-bias dry etching of the upper layer is required.

The lower layer is formed from a material containing tantalum and substantially free from hafnium, zirconium, and oxygen. While the lower layer made of such a material is etched by the dry etching with the fluorine-based gas, it is not easily oxidized relative to the material forming the upper layer, and thus, it may also be patterned by the dry etching with the chlorine-based gas not in a high-bias state. The light shielding film is configured to have the laminated structure of the lower layer and upper layer, so that even if the oxidation of the upper layer has progressed, it is possible to carry out a process of patterning the upper layer by the high-bias dry etching with the chlorine-based gas containing no oxygen gas and patterning the lower layer by the non-high-bias dry etching with the chlorine-based gas containing no oxygen gas. Since the bias for the dry etching of the lower layer is not high, the phenomenon of etching of the etching stopper film may be reduced.

Also, in patterning both the upper layer and lower layer of the light shielding film by the high-bias dry etching with the chlorine-based gas, the configuration of the light shielding film according to the present invention functions effectively. Generally, in patterning a thin film by the dry etching, timing of completion of the patterning varies depending on in-plane regions due to the difference in density between in-plane patterns. In the region where the patterning of the light shielding film is promptly completed and then a surface of the etching stopper film is exposed, the surface of the etching stopper film will be exposed to the high-bias dry etching until the patterning of the entire light shielding film is completed. The lower layer of the light shielding film in the present invention has a significantly higher etching rate for the high-bias dry etching with the chlorine-based gas than the upper layer of the light shielding film.

The light shielding film having the laminated structure of the upper layer and lower layer according to the present invention has a higher etching rate for the high-bias dry etching with the chlorine-based gas than the light shielding film entirely formed from the material for the upper layer. That is, in the light shielding film of the present invention, as for the region where the patterning of the light shielding film is promptly completed and then a surface of the etching stopper film is exposed, the surface of the etching stopper film is exposed to the high-bias dry etching for a short time until the patterning of the entire light shielding film is completed. Thus, when both the upper layer and lower layer of the light shielding film according to the present invention are patterned by the high-bias dry etching with the chlorine-based gas, the phenomenon of etching of the etching stopper film by the high-bias dry etching with the chlorine-based gas may also be reduced.

FIG. 1 is a cross-sectional view showing a layered configuration of a mask blank according to the first embodiment of the present invention. A mask blank 100 of the present invention shown in FIG. 1 has a structure in which a light semitransmissive film 2, an etching stopper film 3, and a light shielding film 4 are laminated in said order on a transparent substrate 1. The light shielding film 4 has a structure in which a lower layer 41 and an upper layer 42 are laminated.

There is no particular limitation on the transparent substrate 1, provided that it is transparent to the exposure wavelength used. In the present invention, a synthetic quartz glass substrate, and various other glass substrates (e.g., soda lime glass, aluminosilicate glass, etc.) may be used. The refinement of a pattern of a semiconductor device requires the refinement of a mask pattern formed in the light semitransmissive film, as well as shortening of a wavelength of an exposure light source used in photolithography in the manufacture of the semiconductor device. Recently, the exposure light sources used in the manufacture of the semiconductor devices are shifting from KrF excimer lasers (wavelength: 248 nm) to ArF excimer lasers (wavelength: 193 nm), that is, shorter wavelength light sources are increasingly used. Since the synthetic quartz glass substrate, among the various glass substrates, has particularly high translucency at a wavelength of the ArF excimer lasers or in a shorter wavelength range, it is suitable as a substrate for the mask blank of the present invention used in forming a high-definition transfer pattern.

The light semitransmissive film 2 is formed from a material which can be dry etched with an etching gas containing a fluorine-based gas. The light semitransmissive film 2 has a function allowing for the transmission of the exposure light at a predetermined transmittance. The light semitransmissive film 2 preferably has a transmittance of 1% or more with respect to the exposure light. The light semitransmissive film 2 is preferably a phase shift film used for a half tone phase shift mask or a light semitransmissive film used for an enhancer phase shift mask.

The light semitransmissive film (phase shift film) 2 for a half tone phase shift mask blank allows the transmission of light at an intensity not substantially contributing to the light exposure (e.g., 1% to 30% with respect to the exposure wavelength), and has a predetermined phase difference (e.g., 180 degrees). A light semitransmissive portion formed by patterning the light semitransmissive film 2, and a light transmissive portion which allows the transmission of light at an intensity substantially contributing to the light exposure and has no light semitransmissive film 2 formed thereon are provided, such that a phase of light transmitted through the light semitransmissive portion is in a substantially inverted relation with respect to a phase of light transmitted through the light transmissive portion. As a result, the light transmitted through the light semitransmissive portion and the light transmitted through the light transmissive portion pass near a boundary between the light semitransmissive portion and the light transmissive portion, and enter the other's region due to a diffraction phenomenon, thereby annihilating both of them, so that a light intensity at the boundary is nearly zero and a contrast, i.e., a resolution, at the boundary is improved.

The light semitransmissive film 2 of the mask blank for the enhancer phase shift mask also allows the transmission of the light at the intensity not substantially contributing to the light exposure (e.g., 1% to 30% with respect to the exposure wavelength). However, it has a small phase difference caused in the transmitted exposure light (e.g., the phase difference of 30 degrees or less, and preferably 0 degrees), which is different from the light semitransmissive film for the half tone phase shift mask blank.

The light semitransmissive film 2 is preferably made of a material containing silicon and nitrogen. Also, the light semitransmissive film 2 is preferably made of a material containing silicon, transition metal, and nitrogen. In this case, the transition metal includes one or more metals of molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), niobium (Nb), palladium (Pd), etc., or alloys of these metals. In addition to the above elements, elements such as nitrogen (N), oxygen (O), carbon (C), hydrogen (H), and boron (B) may be contained in the material for the light semitransmissive film 2. Also, an inactive gas such as helium (He), argon (Ar), krypton (Kr), and xenon (Xe) may be contained in the material for the light semitransmissive film 2.

These materials have a high etching rate with respect to the dry etching with the etching gas containing the fluorine-based gas, and thus, various properties required for the light semitransmissive film 2 may be easily obtained. Specifically, these materials are desirable as materials forming a phase shift film which should strictly control the phase of the exposure light transmitted through the light semitransmissive film 2, or the light semitransmissive film 2 for the enhancer phase shift mask which has a laminated structure of a phase delay film and a phase progression film. If the light semitransmissive film 2 is a half tone phase shift film or semitransparent laminated film, a percentage [%] calculated by dividing the content of transition metal (M) in the film [at % (atomic %)] by the total contents of the transition metal (M) and silicon (Si) [at %] (hereinafter referred to as a M/M+Si ratio) is preferably 35% or less, more preferably 25% or less, and further preferably 20% or less. The transition metal is an element having a higher extinction coefficient and a higher refractive index than silicon. When a refractive index of a material forming a first film is too high, a phase change amount due to a film thickness variation is increased, and thus, it becomes difficult to control both the phase and transmittance.

The lower layer 41 of the light shielding film 4 is formed from a material containing tantalum and substantially free from hafnium, zirconium, and oxygen. Preferably, the material for the lower layer 41 can not only be dry etched with the etching gas containing the chlorine-based gas and no oxygen gas, but also can be dry etched with the etching gas containing the fluorine-based gas. The material satisfying this property includes a material made of tantalum metal, a material made of tantalum and boron, a material made of tantalum and carbon, a material made of tantalum, boron, and carbon, and materials having non-metal elements other than oxygen contained in these materials. An inactive gas such as helium (He), argon (Ar), krypton (Kr), and xenon (Xe) may be contained in the material for the lower layer 41.

The material for the lower layer 41 preferably contains nitrogen. With tantalum containing nitrogen, the oxidation may be more restrained than tantalum containing no nitrogen. On the other hand, as the nitrogen content in the material for the lower layer 41 is increased, the optical density for the material is inevitably lowered. In view of these aspects, the nitrogen content in the material for the lower layer 41 is preferably 30 at % or less, more preferably 20 at % or less, and further preferably 10 at % or less.

Since the lower layer 41 must have a dry etching property different from the upper layer 42, it must comprise a material substantially free from hafnium and zirconium. In the material substantially free from hafnium and zirconium, the total contents of hafnium and zirconium must be at least 5 at % or less, preferably 3 at % or less, and more preferably not more than a detection lower limit in a composition analysis. Further, the lower layer 41 must comprise a material substantially free from oxygen. In the material substantially free from oxygen, the oxygen content must be at least 5 at % or less, preferably 3 at % or less, and more preferably not more than a detection lower limit in a composition analysis.

The upper layer 42 of the light shielding film 4 is formed from a material containing tantalum (Ta) and one or more elements selected from hafnium (Hf) and zirconium (Zr), and substantially free from oxygen excluding the surface layer thereof. The upper layer 42 is preferably formed from a material which can be dry etched with the etching gas containing the chlorine-based gas and no oxygen gas, and which has etch selectivity with respect to the light semitransmissive film 2 in the dry etching with the etching gas containing the fluorine-based gas. The material satisfying this property includes tantalum-hafnium alloy, tantalum-zirconium alloy, tantalum-hafnium-zirconium alloy, or a compound of these alloys containing elements other than oxygen. The material for the upper layer 42 may contain carbon (C) and boron (B), as well as non-metal elements other than oxygen. Further, the material for the upper layer 42 may contain an inactive gas such as helium (He), argon (Ar), krypton (Kr), and xenon (Xe).

If the upper layer 42 made of the material such as tantalum-hafnium alloy, etc. does not contain oxygen, it is possible to obtain an etching rate sufficient to enable formation of the fine pattern by the dry etching with the etching gas containing the chlorine-based gas and no oxygen gas. The material such as tantalum-hafnium alloy, etc. has a property of significantly reducing the etching rate with respect to the etching gas containing the chlorine-based gas and no oxygen gas with an increase in the oxygen content in the material. Even if the oxidation has progressed in the surface layer of the upper layer 42 (up to a depth not greater than about 5 nm from a surface of the film), it is possible to apply a physical etching action to the surface layer to form the fine pattern in the upper layer 42. However, if the oxidation has progressed in the entire upper layer 42, it is difficult to form the fine pattern. Thus, the upper layer 42 is preferably formed from a material substantially free from oxygen excluding its surface layer in which avoidance of the oxidation is difficult. The term "material substantially free from oxygen" here not only includes a material containing no oxygen at all, but also a material containing oxygen to the extent of getting mixed therein due to contamination, etc. during sputtering deposition of the upper layer 42 (a material with the oxygen content of 5 at % or less).

The material forming the upper layer 42 must have the above-described etching property. In order for the material such as tantalum-hafnium alloy, etc. to have this etching property, a ratio expressed in percentage calculated by dividing the total contents of hafnium and zirconium in the material [at %] by the total contents of tantalum, hafnium, and zirconium [at %] (hereinafter referred to as a [Hf+Zr]/

[Ta+Hf+Zr] ratio) is desirably 10% or more. Tantalum can be dry etched with the chlorine-based gas containing no oxygen, and also be dry etched with the etching gas containing the fluorine-containing gas. Thus, the etching tolerance to the etching gas containing the fluorine-based gas may not be ensured by tantalum alone. If the [Hf+Zr]/[Ta+Hf+Zr] ratio is less than 10%, the tolerance to the etching gas containing the fluorine-based gas is lowered, and thus, it becomes difficult for the upper layer to act as an etching mask during the dry etching with the etching gas containing the fluorine-based gas for forming the transfer pattern in the light semitransmissive film 2. In view of the tolerance to cleaning liquid in cleaning of the transfer mask, it is better to increase the tantalum content ratio, and the [Hf+Zr]/[Ta+Hf+Zr] ratio in the upper layer 42 is preferably 50% or less.

The light shielding film 4 functions as the etching mask during the dry etching for forming a fine transfer pattern in the light semitransmissive film 2 by the upper layer 42 alone. The material forming the upper layer 42 should be patterned by the high-bias dry etching when the oxidation of tantalum-hafnium alloy, etc. has progressed. During the high-bias dry etching, an etching rate difference due to factors such as the difference in density between in-plane patterns tends to be increased. Thus, a ratio of an amount of time for the high-bias dry etching to an amount of time required to etch the entire light shielding film 4 is desirably small.

As mentioned above, even if both the upper layer 42 and lower layer 41 of the light shielding film 4 are patterned by the high-bias dry etching with the chlorine-based gas, as the etching rate for the entire light shielding film 4 gets higher, the phenomenon of etching of the etching stopper film 3 by the high-bias dry etching with the chlorine-based gas may be reduced. In view of these aspects, the lower layer 41 of the light shielding film 4 is preferably thicker than the upper layer 42.

In order for the upper layer 42 to function as the etching mask during the dry etching for forming the fine transfer pattern in the light semitransmissive film, the thickness of the upper layer 42 is preferably 3 nm or more, more preferably 5 nm or more, and further preferably 7 nm or more. In order to shorten the amount of time for the high-bias dry etching, the thickness of the upper layer 42 is preferably 20 nm or less, more preferably 15 nm or less, and further preferably 10 nm or less.

The ratio of the upper layer 42 to the entire thickness of the light shielding film 4 is preferably 1/10 or more, more preferably 1/5 or more, and further preferably 1/4 or more. The ratio of the upper layer 42 to the entire thickness of the light shielding film 4 is preferably 2/3 or less, more preferably 1/2 or less, and further preferably 1/3 or less.

In the mask blank of the present invention, the laminated structure of the light semitransmissive film 2, etching stopper film 3, and light shielding film 4 must have 2.8 or more of optical density (OD) with respect to the exposure light, and 3.0 or more of OD is preferable. An ArF excimer laser (wavelength: 193 nm) is preferably used for the exposure light. In view of functions required for respective films in the above-described laminated structure (laminated film), the light shielding film 4 desirably has higher optical density. The simplest way to provide the light shielding film 4 with high optical density is to increase the film thickness.

The light shielding film 4 functions as the etching mask during the dry etching for forming the fine transfer pattern in the light semitransmissive film 2 by the upper layer 42 alone. However, since the light shielding film 4 has the laminated structure of the lower layer 41 and upper layer 42, the light semitransmissive film 2 is dry etched using a pattern formed with the entire light shielding film 4 as the etching mask. In order to form the fine transfer pattern in the light semitransmissive film 2 with great accuracy, the thickness of the entire light shielding film 4 is desirably reduced as much as possible. As described above, the lower layer 41 preferably contains nitrogen in order to inhibit the oxidation of the material, and there is a limit on the increase in optical density of the material itself of the lower layer 41.

The upper layer 42 is desirably substantially free from oxygen, and does not have to contain a non-metal element that functions to reduce the optical density of the material itself. Thus, the upper layer 42 is preferably formed from a material not containing the non-metal element reducing the optical density. From this point of view, a material selected from tantalum-hafnium alloy, tantalum-zirconium alloy, and tantalum-hafnium-zirconium alloy is preferably used as the material forming the upper layer 42. The entire thickness of the light shielding film 4 is preferably 40 nm or less, and more preferably 35 nm or less.

The etching stopper film 3 must have a function for preventing the light semitransmissive film 2 from being etched during the dry etching with the chlorine-based gas not containing oxygen which is performed to remove the light shielding film left on the light semitransmissive pattern and form a light shielding pattern (a pattern of a light shielding band, etc.) after formation of the light semitransmissive pattern in the light semitransmissive film 2 in the manufacturing process of the transfer mask (described below in detail). The etching stopper film 3 in the first embodiment is removed from above the light semitransmissive film 2 with the light semitransmissive pattern formed therein upon completion of the transfer mask. Thus, the light semitransmissive film 2 must have an etching tolerance to an etching gas used in the dry etching of the etching stopper film 3. Therefore, a material containing chromium as a main component is used for the etching stopper film 3.

In the manufacturing process of the transfer mask, the light shielding film 4 is patterned twice by the dry etching. The first dry etching is performed in forming in the light shielding film 4 the transfer pattern (light semitransmissive pattern) to be formed in the light semitransmissive film 2. The second dry etching is performed in forming in the light shielding film 4 a pattern (pattern of the light shielding band, etc.) to be formed in the light shielding film 4. In dry etching for both the upper layer 42 and lower layer 41 of the light shielding film 4, the used etching gas contains the chlorine-based gas and no oxygen gas. In the first dry etching, there is little progression of oxidation in the upper layer 42 excluding its surface layer, and thus, a pattern may be satisfactorily formed in the upper layer 42 with a normal etching bias by which a physical effect is not so strong. However, in the second dry etching, the oxidation of the upper layer 42 has progressed due to various treatments such as cleaning performed in the previous process, and thus, it is difficult to form a pattern in the upper layer 42 unless the dry etching with a high etching bias (in a high-bias state), which tends to have a strong physical effect, is performed.

In the second dry etching, while the patterning by the high-bias dry etching should be performed on the upper layer 42, the patterning by the normal-bias dry etching may be performed on the lower layer 41. In the dry etching of the light shielding film 4 with the etching gas containing the chlorine-based gas and no oxygen gas, while it is possible to pattern the upper layer 42 in the high-bias state and change to the normal-bias state in midstream to pattern the lower layer 41, the control may not easy, for example, if there is a large difference in density between patterns.

When the etching stopper film 3 is made of the chromium-containing material, the tolerance to the dry etching in the high-bias state with the etching gas containing the chlorine-based gas and no oxygen gas is desirably taken into account. Then, the experiment was performed, in which the dry etching in the high-bias state was performed on 7 types of sample films made from chromium-based materials shown in Table 1 using the chlorine-based gas ($Cl_2$) as the etching gas, and the etching rates for respective sample films were confirmed. The etching rates of respective sample films with respect to the chlorine-based gas ($Cl_2$) are shown in FIG. 2. The etching bias in this experiment was 50 W.

TABLE 1

| Sample | Film material | Content in Film [at %] | | | |
|---|---|---|---|---|---|
| | | Cr | O | N | C |
| A | CrO-based | 95.9 | 4.1 | — | — |
| B | Cr(O)N-based | 74.0 | 11.0 | 15.0 | — |
| C | CrOCN-based | 55.7 | 19.3 | 16.2 | 8.8 |
| D | CrO-based | 71.7 | 28.3 | — | — |
| E | CrOCN-based | 35.1 | 38.1 | 16.4 | 10.4 |
| F | CrO-based | 47.5 | 52.5 | — | — |
| G | CrO-based | 41.0 | 59.0 | — | — |
| H | CrO-based | 33.7 | 66.3 | — | — |

According to the result in FIG. 2, when the oxygen content in the chromium-based material film is greater than 20%, the degree of increase in the etching rate with respect to the chlorine-based gas in the high-bias state becomes high, and the etching rate itself also becomes as high as 6.0 nm/minute or more. When the dry etching is performed on the light shielding film 4 made of the material such as tantalum-hafnium alloy, etc., in which the oxidation has progressed, a region where the light shielding film 4 is removed early to expose the etching stopper film 3 within a plane continues to be exposed to the chlorine-based gas containing no oxygen in the high-bias state until the patterning of the light shielding film 4 is completed. If the tolerance to the dry etching in the high-bias state using the chlorine-based gas with no oxygen is low, the etching stopper film 3 in the region disappears. As a result, the surface layer of the light semitransmissive film 2 just below the disappeared portion is damaged due to exposure to the chlorine-based gas with no oxygen in the high-bias state. After consideration on the experimental result, etc. shown in FIG. 2, a conclusion that the oxygen content in the chromium-based material film forming the etching stopper film 3 is preferably 20 at % or less was derived.

The dry etching in the high-bias state tends to have a strong physical effect. Thus, the tolerance to the dry etching in the high-bias state using the chlorine-based gas with no oxygen varies depending on the content of chromium, a metal component, in the chromium-based material film, while not as remarkable as the oxygen content in the chromium-based material film. In view of the result, etc. of FIG. 2, the chromium content in the chromium-based material film forming the etching stopper film 3 is preferably 55 at % or more.

The chromium-containing material forming the etching stopper film 3 tends to have lower optical density with respect to the exposure light than the material such as tantalum-hafnium alloy, etc. forming the upper layer 42 of the light shielding film 4, or the material containing tantalum and substantially free from hafnium, zirconium, and oxygen, for forming the lower layer 41. In the transfer mask fabricated from the mask blank according to the first embodiment, the light shielding band is formed with the laminated structure of the etching stopper film 3 and light shielding film 4. Thus, the laminated structure of the etching stopper film 3 and light shielding film 4 must ensure the predetermined optical density. In order for the laminated structure of the etching stopper film 3 and light shielding film 4 having a thinner total film thickness to ensure the predetermined optical density, the thickness of the etching stopper film 3 is desirably reduced as much as possible. On the other hand, in view of protection of the light semitransmissive film 2 against the dry etching in the high-bias state using the chlorine-based gas containing no oxygen, as for the film thickness of the etching stopper film 3, the thicker, the better. In comprehensive consideration of these aspects, the thickness of the etching stopper film 3 is preferably 8 nm or less. The thickness of the etching stopper film 3 is more preferably 3 nm or more. The thickness of the etching stopper film 3 is further preferably from 5 nm to 7 nm inclusive.

The light shielding film 4 may comprise, in addition to the laminated structure of the lower layer 41 and upper layer 42, an uppermost layer adjacent to the surface layer of the upper layer 42. The uppermost layer is preferably formed from a material containing tantalum and substantially free from hafnium and zirconium. By providing the uppermost layer, the oxidation of the surface layer of the upper layer 42 may be inhibited. In order to inhibit the oxidation of the surface layer of the upper layer 42, the thickness of the uppermost layer should be at least 3 nm or more, and is preferably 4 nm or more. Also, the thickness of the uppermost layer is preferably 10 nm or less, and more preferably 8 nm or less.

Since the uppermost layer is located on the side of the outermost surface of the light shielding film 4, it preferably does not contain oxygen at the stage for forming the uppermost layer by a sputtering deposition method, etc. Even if the uppermost layer is formed in a manner not to contain oxygen during its formation, the oxidation is progressed from its surface layer side once it is exposed to air. Thus, when the chlorine-based gas containing no oxygen gas is applied for the dry etching for forming the fine transfer pattern in the light shielding film 4 including the uppermost layer, the dry etching under the high-bias condition should be performed at least on the uppermost layer. Therefore, the etching stopper film 3, etc. desirably meets the condition similar to the case when the surface layer of the upper layer 42 has been oxidized, even if the uppermost layer is provided.

If the light shielding film 4 is provided with the uppermost layer, the surface layer of the upper layer 42 preferably has not been oxidized. For example, when the lower layer 41, upper layer 42, and uppermost layer are formed by sputtering in said order and the transparent substrate 1 is never exposed to air during the sputtering, the oxidation of the surface layer of the upper layer 42 may be inhibited.

While a method for forming the light semitransmissive film 2, etching stopper film 3, and light shielding film 4 on the transparent substrate 1 preferably includes, for example, a sputtering deposition method, it is not necessarily limited to the sputtering deposition method in the present invention.

The first embodiment of the present invention also provides a transfer mask in which a light semitransmissive pattern is formed in the light semitransmissive film of the mask blank according to the above first embodiment and light shielding band patterns are formed in the etching mask film and light shielding film, and a method for manufacturing the transfer mask. FIGS. 3(*a*)-(*h*) are cross-sectional views showing the manufacturing process of the transfer mask according to the first embodiment of the present invention. The method for manufacturing the transfer mask according to the first embodiment is described below in accordance with the manufacturing process shown in FIGS. 3(a)-(h). The configuration of the mask blank 100 used here (FIG. 3(a)) is as stated above.

First, a first resist film 5 made of an organic material is formed adjacent to a surface of the upper layer 42 of the mask blank 100 (FIG. 3(a)). Next, a desired light semitransmissive pattern (transfer pattern) to be formed in the light semitransmissive film 2 is drawn on the first resist film 5 formed on the mask blank 100. After the drawing, a development process is conducted, such that a first resist pattern 5a having the desired light semitransmissive pattern is formed (FIG. 3(b)). Then, by the dry etching using as a mask the first resist pattern 5a having the light semitransmissive pattern, a light shielding film 4a comprised of a laminated structure of an upper layer 42a and lower layer 41a having the light semitransmissive patterns respectively is formed (FIG. 3(c)).

For the upper layer 42 and lower layer 41 made of the material such as tantalum-hafnium alloy, etc. according to the present invention, the dry etching using the etching gas containing the chlorine-based gas and no oxygen gas, with a normal etching bias by which a physical effect is not so strong, is preferably performed. The chlorine-based gas used in the dry etching of the upper layer 42 and lower layer 41 includes, for example, $Cl_2$, $SiCl_4$, $CHCl_3$, $CH_2Cl_2$, $CCl_4$, $BCl_3$, etc. After the light semitransmissive pattern is formed in the light shielding film 4, the remaining first resist pattern 5a is removed. The removal of the first resist pattern 5a is often performed by an ashing process with oxygen plasma. After the ashing process, a cleaning process is conducted. With these processes, the oxidation of the upper layer 42a is inevitably progressed.

Next, by the dry etching using as a mask the light shielding film 4a with the light semitransmissive pattern formed therein, an etching stopper film 3a having a light semitransmissive pattern is formed (FIG. 3(d)). In this dry etching, a mixed gas of the chlorine-based gas and oxygen gas is used as the etching gas. As for the chlorine-based gas, the one used for the above upper layer 42, etc. is applicable. Since the oxygen plasma also hits the upper layer 42a during the dry etching of the etching stopper film 3, the oxidation of the upper layer 42a is further progressed due to this process.

Then, by the dry etching using as a mask the light shielding film 4a (upper layer 42a) with the light semitransmissive pattern formed therein, a light semitransmissive film (light semitransmissive pattern 2a) 2a having the light semitransmissive pattern is formed (FIG. 3(e)). In this dry etching, the etching gas containing the fluorine-based gas such as $SF_6$, $CHF_3$, $CF_4$, $C_2F_6$, and $C_4F_8$ is used. Among the fluorine-based gases, $SF_6$ has relatively high etch selectivity with respect to the transparent substrate 1 and is preferable.

Next, a second resist film is formed on the light shielding film 4a, and a desired light shielding band pattern (transfer pattern) to be formed in the light shielding film 4 is drawn on the second resist film. After the drawing, the development process is conducted, such that a second resist pattern 6b having the desired light shielding band pattern is formed (FIG. 3(f)). Then, by the dry etching using as a mask the second resist pattern 6b having the light shielding band pattern, a light shielding film 4b having the light shielding band pattern is formed (FIG. 3(g)).

In this dry etching, the used etching gas itself is the chlorine-based gas as used in the formation of the light semitransmissive patterns in the upper layer 42 and lower layer 41. However, since the material for the upper layer 42a has been significantly oxidized at this stage, it is difficult to form the light shielding band pattern with great accuracy by using the etching bias applied in the dry etching for forming the light semitransmissive pattern in the upper layer 42, which will result in a significantly slow etching rate. Therefore, the etching bias in the dry etching for forming the light shielding band pattern in the upper layer 42a is made to be significantly higher than the etching bias applied in the dry etching for forming the light semitransmissive pattern in the upper layer 42.

As for the lower layer 41a, while its material has been oxidized to some degree, the degree of lowering of the etching rate is smaller than in the upper layer 42a. Thus, the etching bias in the dry etching for forming the light shielding band pattern in the lower layer 41a may be comparable with the etching bias in the dry etching for forming the light semitransmissive pattern in the lower layer 41. In the dry etching for the upper layer 42a and lower layer 41a, a surface of the light semitransmissive film 2a having the light semitransmissive pattern is protected by the etching stopper film 3a. After the light shielding band pattern is formed in the light shielding film 4a, the remaining second resist pattern 6b is removed.

Next, by the dry etching using as a mask the light shielding film 4b with the light shielding band pattern formed therein, an etching stopper film 3b having the light shielding band pattern is formed. In the transfer mask according to the first embodiment, a light shielding band is formed from the laminated structure of the etching stopper film 3b and light shielding film 4b. After that, predetermined cleaning is conducted, such that a transfer mask 200 is obtained (FIG. 3(h)).

As described above, the transfer mask in the first embodiment of the present invention is characterized in that the light semitransmissive pattern is formed in the light semitransmissive film of the mask blank in the first embodiment of the present invention, and the light shielding band patterns are formed in the etching stopper film and light shielding film.

That is, the transfer mask in the first embodiment has a structure in which the light semitransmissive pattern and light shielding band pattern are laminated on the main surface of the transparent substrate. The light semitransmissive pattern is formed from a material which can be dry etched with the etching gas containing the fluorine-based gas. The light shielding band pattern is comprised of a laminated structure of the light shielding pattern having a pattern of the light shielding band, and an etching stopper film pattern provided between the light semitransmissive pattern and light shielding pattern and having the pattern of the light shielding band. The light shielding pattern is comprised of the laminated structure of the lower layer and upper layer. The lower layer is made of the material containing tantalum and substantially free from hafnium, zirconium, and oxygen. The upper layer is made of the material containing tantalum and one or more elements selected from hafnium and zirconium, and free from oxygen excluding its surface layer. The etching stopper film pattern is formed from the chromium-containing material.

Then, a second embodiment of the present invention is described below in detail.

The second embodiment of the present invention is a mask blank having a structure in which the light semitransmissive film 2 and light shielding film 4 are laminated on the main surface of the transparent substrate 1, and has a configuration similar to the mask blank of the first embodiment excluding the etching stopper film 3. The mask blank of the second embodiment is different from the mask blank of the first embodiment in that the etching stopper film 3 is formed from a material containing silicon and oxygen. The etching stopper film 3 formed from the material containing silicon and oxygen has etch selectivity with respect to the lower layer 41 in the dry etching with the etching gas containing the chlorine-based gas and no oxygen gas which is performed for patterning the lower layer 41.

When the transfer mask is fabricated from the mask blank of the second embodiment, the etching stopper film 3 is left on the light semitransmissive film 2 having the light semitransmissive pattern formed therein. Thus, unlike the etching stopper film 3 in the first embodiment, it is not necessary to ensure the etch selectivity between the etching stopper film 3 and light semitransmissive film 2. The etching stopper film 3 of the second embodiment constitutes the light semitransmissive pattern by the structure laminated with the light semitransmissive film 2 upon the completion of the transfer mask. From these aspects, the material for forming the etching stopper film 3 should be selected to meet two conditions: to have the etch selectivity with respect to the lower layer 41 in the dry etching with the etching gas containing the chlorine-based gas and no oxygen gas; and to function as one of the layers constituting the light semitransmissive pattern.

The material which meets these two conditions includes the material containing silicon and oxygen. The material containing silicon and oxygen has a relatively high transmittance with respect to the exposure light, a relatively small amount of phase shift, and a relatively small effect on an optical property of the light semitransmissive pattern comprised of the laminated structure of the etching stopper film 3 and light semitransmissive film 2. The material for forming the etching stopper film 3 preferably does not contain metal. It is because the etching stopper film 3 formed from the material containing the metal has a large effect on the optical property of the light semitransmissive pattern. The material suitable for the etching stopper film 3 in the second embodiment includes materials comprising silicon and one or more elements selected from oxygen, nitrogen, carbon, hydrogen, boron, and fluorine. Among these materials, a material comprising silicon and oxygen, or a material comprising silicon, oxygen, and nitrogen is especially preferable.

In the mask blank of the second embodiment according to the present invention, the light shielding film 4 may also comprise, in addition to the laminated structure of the lower layer 41 and upper layer 42, the uppermost layer adjacent to the surface layer of the upper layer 42. The other details for the uppermost layer are similar to those of the first embodiment.

The second embodiment of the present invention also provides a transfer mask in which light semitransmissive patterns are formed in the light semitransmissive film and etching stopper film of the mask blank according to the above second embodiment and the light shielding band pattern is formed in the light shielding film, and a method for manufacturing the transfer mask. FIGS. 4(*a*)-(*f*) are cross-sectional views showing the manufacturing process of the transfer mask according to the second embodiment of the present invention. The method for manufacturing the transfer mask according to the second embodiment is described below in accordance with the manufacturing process shown in FIGS. 4(*a*)-(*f*). The configuration of the mask blank 100 used here (FIG. 4(*a*)) is as stated above.

First, a first resist film 5 made of an organic material is formed adjacent to a surface of the upper layer 42 of the above mask blank 100 (FIG. 4(*a*)). Next, a desired light semitransmissive pattern (transfer pattern) to be formed in the light semitransmissive film 2 is drawn on the first resist film 5 formed on the mask blank 100. After the drawing, the development process is conducted, such that a first resist pattern 5*a* having the desired light semitransmissive pattern is formed (FIG. 4(*b*)). Then, by the dry etching using as a mask the first resist pattern 5*a* having the light semitransmissive pattern, a light shielding film 4*a* comprised of a laminated structure of an upper layer 42*a* and lower layer 41*a* having the light semitransmissive patterns respectively is formed (FIG. 4(*c*)). The etching condition including the etching gas in this dry etching is similar to the etching condition used in the method for manufacturing the transfer mask in the first embodiment.

Next, the dry etching using as a mask the light shielding film 4*a* (upper layer 42*a*) with the light semitransmissive pattern formed therein is conducted on the etching stopper film 3 and light semitransmissive film 2, thereby forming an etching stopper film 3*a* and light semitransmissive film 2*a* having the light semitransmissive patterns respectively (FIG. 4(*d*)). The etching gas used in this dry etching is the one used in the dry etching for the light semitransmissive film 2 in the method for manufacturing the transfer mask in the first embodiment.

Then, a second resist film is formed on the light shielding film 4*a*, and a desired light shielding band pattern (transfer pattern) to be formed in the light shielding film 4 is drawn on the second resist film. After drawing, the development process is conducted, such that a second resist pattern 6*b* having the desired light shielding band pattern is formed (FIG. 4(*e*)). Then, by the dry etching using as a mask the second resist pattern 6*b* having the light shielding band pattern, a light shielding film 4*b* having the light shielding band pattern is formed (FIG. 4(*f*)). This dry etching is similar to the dry etching conducted to form the light shielding band pattern in the method for manufacturing the transfer mask in the first embodiment.

Next, the remaining second resist pattern 6*b* is removed. In this transfer mask of the second embodiment, the light shielding band is formed by the light shielding film 4*b* alone. After that, the predetermined cleaning is conducted, such that a transfer mask 200 is obtained (FIG. 4(*f*)).

As described above, the transfer mask in the second embodiment of the present invention is characterized in that the light semitransmissive patterns are formed in the light semitransmissive film and etching stopper film of the mask blank in the second embodiment of the present invention, and the light shielding band pattern is formed in the light shielding film.

That is, the transfer mask in the second embodiment has a structure in which the light semitransmissive pattern and light shielding band pattern are laminated on the main surface of the transparent substrate. The light semitransmissive pattern is comprised of a laminated structure of a pattern formed in the light semitransmissive film and the etching stopper film pattern. The light semitransmissive film is formed from the material which can be dry etched with the etching gas containing the fluorine-based gas. The etching stopper film pattern is formed from the material containing silicon and oxygen. The light shielding band pattern is comprised of the light shielding pattern having the pattern of the light shielding band. The light shielding pattern is made of the laminated structure of the lower layer and upper layer. The lower layer is made of the material containing tantalum and substantially free from hafnium, zirconium, and oxygen. The upper layer is made of the material containing tantalum and one or more elements selected from hafnium and zirconium, and free from oxygen excluding its surface layer.

Then, a third embodiment of the present invention is described below in detail.

The third embodiment of the present invention is different from the mask blanks of the first and second embodiments in that a hard mask film 7 is additionally provided on the upper layer 42 (or on the uppermost layer, if provided) of the light shielding film 4 of the mask blank of the first or second embodiment (FIG. 5(*a*)).

That is, the third embodiment of the present invention is a mask blank 101 having a structure in which the light semitransmissive film 2, light shielding film 4, and hard mask film 7 are laminated on the main surface of the transparent substrate 1. In particular, the light semitransmissive film 2 is formed from the material which can be dry etched with the etching gas containing the fluorine-based gas. The light shielding film 4 at least includes the laminated structure of the lower layer 41 and upper layer 42. The lower layer 41 is formed from the material containing tantalum and substantially free from hafnium, zirconium, and oxygen, and the upper layer 42 is formed from the material containing tantalum and one or more elements selected from hafnium and zirconium, and substantially free from oxygen excluding its surface layer. Provided between the light semitransmissive film 2 and lower layer 41 is the etching stopper film 3 which is made of a material having etch selectivity with respect to the lower layer 41 in the dry etching with the etching gas containing the chlorine-based gas and no oxygen gas.

While this hard mask film 7 is a material which may be patterned by the dry etching with the fluorine-based gas, it has a high tolerance to the dry etching with the chlorine-based gas. That is, the hard mask film 7 functions as the etching mask in forming a pattern in the light shielding film 4. The hard mask film 7 is made of a material having etch selectivity with respect to the light shielding film 4 in the dry etching with the etching gas containing the chlorine-based gas and no oxygen gas which is performed for patterning the light shielding film 4. The hard mask film 7 is preferably formed from the material containing silicon and oxygen.

The resist film 5 is reduced in thickness also by the dry etching with the fluorine-based gas or chlorine-based gas free from oxygen. The reduction in film thickness is progressed not only from an upper surface of the resist pattern, but also from pattern side walls (which is referred to as side etching). The pattern formed in the resist film 5 is made to have a wide width in prospect of decrease in line width due to this side etching. The difference between the line width of the pattern to be actually formed in the light shielding film 4 or hard mask film 7 and the line width of the pattern formed in the resist film is referred to as etching bias. Since the hard mask film 7 may be thinner than the light shielding film 4, the time spent on the dry etching for forming the fine transfer pattern may be reduced. That is, by providing the hard mask film 7 made of the material containing silicon and oxygen on the light shielding film 4, the etching bias for the pattern formed in the resist film may be reduced.

By providing the hard mask film 7, the oxidation of the surface layer of the light shielding film 4 may be inhibited. The thickness of the hard mask film 7 must be at least 3 nm or more, and is preferably 4 nm or more. The thickness of the hard mask film 7 must be 15 nm or less, is preferably 10 nm or less, and is more preferably 8 nm or less. The hard mask film 7 is preferably formed from a material containing silicon, oxygen, and one or more elements selected from nitrogen, carbon, hydrogen, boron, and fluorine. Particularly preferably, the hard mask film 7 is formed from the material comprising silicon and oxygen, or the material comprising silicon, oxygen, and nitrogen.

The hard mask film 7 disappears during the dry etching using the fluorine-based gas performed for forming the fine pattern in the light semitransmissive film 2. Thus, due to the cleaning process, etc. after patterning the light semitransmissive film 2, the oxidation of the light shielding film 4 is progressed from its surface layer side. Therefore, the dry etching with the chlorine-based gas not containing the oxygen gas, which is performed to form the pattern of the light shielding band in the light shielding film 4, should be performed under the high-bias condition. Thus, the etching stopper film 3, etc. desirably meets the condition similar to the case when the upper layer 42 of the light shielding film 4 has been oxidized, even if the hard mask film 7 is provided.

If the hard mask film 7 is provided on the light shielding film 4, the surface layer of the upper layer 42 preferably has not been oxidized. For example, when the lower layer 41, upper layer 42, and hard mask film 7 are formed by sputtering in said order and the transparent substrate 1 is never exposed to air during the sputtering, the oxidation of the surface layer of the upper layer 42 may be inhibited.

The third embodiment of the present invention also provides a transfer mask and a method for manufacturing the transfer mask. FIGS. 5(*a*)-(*f*) are cross-sectional views showing the manufacturing process of the transfer mask according to the third embodiment of the present invention. The method for manufacturing the transfer mask according to the third embodiment is described below in accordance with the manufacturing process shown in FIGS. 5(*a*)-(*f*). The mask blank 101 used here (FIG. 5(*a*)) has a configuration in which the hard mask film 7 is provided on the light shielding film 4 in the mask blank of the second embodiment (mask blank comprising the etching stopper film 3 formed from the material containing silicon and oxygen).

First, a first resist film 5 made of an organic material is formed adjacent to a surface of the hard mask film 7 of the mask blank 101 (FIG. 5(*a*)). Next, a desired light semitransmissive pattern (transfer pattern) to be formed in the light semitransmissive film 2 is drawn on the first resist film 5 formed on the mask blank 101. After the drawing, the development process is conducted, such that a first resist pattern 5*a* having the desired light semitransmissive pattern is formed (FIG. 5(*b*)). Then, by the dry etching using as a mask the first resist pattern 5*a* having the light semitransmissive pattern, a hard mask film 7*a* having the light semitransmissive pattern is formed (FIG. 5(*b*)). The etching gas used in this dry etching is the fluorine-based gas described above.

Next, by the dry etching using as a mask the hard mask film 7*a* having this light semitransmissive pattern, the light shielding film 4*a* comprised of the laminated structure of the upper layer 42*a* and lower layer 41*a* having the light semitransmissive patterns respectively is formed. The etching condition including the etching gas in this dry etching is similar to the etching condition used in the method for manufacturing the transfer mask in the first embodiment. Then, the first resist pattern 5*a* remaining on the hard mask film 7*a* is peeled (FIG. 5(*c*)).

Next, the dry etching using as a mask the light shielding film 4*a* (upper layer 42*a*) with the light semitransmissive pattern formed therein is conducted on the etching stopper film 3 and light semitransmissive film 2, thereby forming the etching stopper film 3*a* and light semitransmissive film 2*a* having the light semitransmissive patterns respectively (FIG. 5(d)). The dry etching is similar to that of the method for manufacturing the transfer mask in the second embodiment. By this dry etching, the hard mask film 7a is etched and disappears.

Then, a second resist film is formed on the light shielding film 4a, and a desired light shielding band pattern (transfer pattern) to be formed in the light shielding film 4 is drawn on the second resist film. After drawing, the development process is conducted, such that the second resist pattern 6b having the desired light shielding band pattern is formed (FIG. 5(e)). Then, by the dry etching using as a mask the second resist pattern 6b having the light shielding band pattern, the light shielding film 4b having the light shielding band pattern is formed (FIG. 5(f)). This dry etching is similar to the dry etching conducted to form the light shielding band pattern in the method for manufacturing the transfer mask in the first embodiment.

Next, the remaining second resist pattern 6b is removed. In this transfer mask of the third embodiment, the light shielding band is formed by the light shielding film 4b alone. After that, the predetermined cleaning is conducted, such that a transfer mask 200 is obtained (FIG. 5(f)).

As for a transfer mask using the mask blank 101 comprising the hard mask film 7 provided on the light shielding film 4 in the mask blank of the first embodiment, or a method for manufacturing the transfer mask, all aspects are similar to the above cases, except for details related to the patterning of the etching mask film 3 (refer to the method for manufacturing the transfer mask in the first embodiment).

As described above, the transfer mask in the third embodiment of the present invention is characterized in that the light semitransmissive patterns are formed in the light semitransmissive film and etching stopper film of the mask blank in the third embodiment of the present invention, and the light shielding band pattern is formed in the light shielding film.

EXAMPLES

The embodiments of the present invention are specifically described below based on Examples.

Example 1

A transparent substrate 1 having a main surface dimension of about 152 mm× about 152 mm and a thickness of about 6.35 mm and made of synthetic quartz glass was prepared. End faces and the main surface of the transparent substrate 1 were polished to have predetermined surface roughness, and then subjected to predetermined cleaning and drying processes.

Then, the transparent substrate 1 was placed in a single-wafer DC sputtering device, a mixed target of molybdenum (Mo) and silicon (Si) (Mo:Si=12 at %:88 at %) was used, and reactive sputtering (DC sputtering) in a mixed gas atmosphere of argon (Ar), nitrogen ($N_2$), and helium (He) was performed, such that the light semitransmissive film 2 made of molybdenum, silicon, and nitrogen (MoSiN film; Mo: 12 at %, Si: 39 at %, N: 49 at %), having a film thickness of 69 nm, was formed on the substrate 1. The composition of the MoSiN film was obtained as a result from Auger electron spectroscopy (AES). The same goes for the other films below.

Then, on the transparent substrate 1 with the MoSiN film (light semitransmissive film 2) formed thereon, a process for forming an oxidized layer on the surface layer of the light semitransmissive film 2 was conducted. In particular, a heating furnace (electric furnace) was used to conduct a heating process at a heating temperature of 450 degrees C. in the air for one hour. The light semitransmissive film 2 after the heating process was analyzed by Auger electron spectroscopy (AES). As a result, it was found that the oxidized layer having a thickness of about 1.5 nm measured from the surface of the light semitransmissive film 2 was formed and had the oxygen content of 42 at %. For the MoSiN film (light semitransmissive film 2) after the heating process, the transmittance and phase difference at a wavelength of light of the ArF excimer laser (about 193 nm) were measured by a phase shift amount measuring device. As a result, the transmittance was 6.07%, and the phase difference was 177.3 degrees.

Then, the transparent substrate 1 was placed in the single-wafer DC sputtering device, a chromium (Cr) target was used, and the reactive sputtering (DC sputtering) in the mixed gas atmosphere of argon (Ar), nitrogen ($N_2$), and helium (He) was conducted, such that the etching stopper film 3 made of chromium and nitrogen (CrN film; Cr: 81 at %, N: 19 at %), having a film thickness of 5 nm, was formed adjacent to the surface of the light semitransmissive film 2.

Next, the transparent substrate 1 was placed in the single-wafer DC sputtering device, a tantalum (Ta) target was used, and the sputtering (DC sputtering) in a nitrogen ($N_2$) and xenon (Xe) gas atmosphere was conducted, such that the lower layer 41 of the light shielding film 4, made of tantalum and nitrogen (TaN film; Ta: 88.7 at %, N: 11.3 at %) and having a film thickness of 20 nm, was formed adjacent to the surface of the etching stopper film 3.

Next, the transparent substrate 1 was placed in the single-wafer DC sputtering device, a mixed target of tantalum (Ta) and hafnium (Hf) (Ta:Hf=80 at %:20 at %) was used, and the sputtering (DC sputtering) in a xenon (Xe) gas atmosphere was conducted, such that the upper layer 42 of the light shielding film 4, made of tantalum and hafnium (TaHf film; Ta: 86.4 at %, Hf: 13.5 at %) and having a film thickness of 10 nm, was formed adjacent to the surface of the lower layer 41. Further, the predetermined cleaning process was conducted, such that the mask blank 100 of Example 1 was obtained.

[Manufacture of the Transfer Mask]

Then, the mask blank 100 of Example 1 was used to fabricate the transfer mask 200 of Example 1 through the following procedure. First, the first resist film 5 having a film thickness of 80 nm and made of a chemically amplified resist for electron beam drawing was formed adjacent to the surface of the light shielding film 4 (upper layer 42) through a spin coating method (FIG. 3(a)). Then, the light semitransmissive pattern to be formed in the light semitransmissive film 2, a transfer pattern of DRAM hp32 nm generation (a fine pattern including SRAF with a line width of 40 nm), was drawn with an electron beam on the first resist film 5, and the predetermined development and cleaning processes were conducted, such that the first resist film 5 (first resist pattern 5a) having the light semitransmissive pattern was formed (FIG. 3(b)). Next, the dry etching with a chlorine gas ($Cl_2$) using the first resist pattern 5a as a mask was performed, such that the light shielding film 4a (lower layer 41a and upper layer 42a) having the light semitransmissive pattern was formed. The etching bias in this dry etching was 15 W, which was a dry etching condition for normal dry etching. Subsequently, the first resist pattern 5a was removed (FIG. 3(c)).

Next, the dry etching with a mixed gas of chlorine and oxygen (gas flow ratio of $Cl_2:O_2=4:1$) was conducted using as a mask the light shielding film 4a (upper layer 42a) having the light semitransmissive pattern formed therein, such that the etching stopper film 3a having the light semitransmissive pattern was formed (FIG. 3(d)). Then, the dry etching with the etching gas containing the fluorine-based gas ($SF_6$+He) was conducted using as a mask the light shielding film 4a (upper layer 42a) having the light semitransmissive pattern formed therein, such that the light semitransmissive film 2a having the light semitransmissive pattern was formed (FIG. 3(e)).

Next, a second resist film having a film thickness of 80 nm and made of the chemically amplified resist for electron beam drawing was formed adjacent to the light shielding film 4a. Subsequently, the light shielding band pattern to be formed in the light shielding film 4 was drawn with the electron beam on the second resist film, and the predetermined development and cleaning processes were conducted, such that the resist film 6b (second resist pattern 6b) having the light shielding band pattern was formed (FIG. 3(f)). Next, the dry etching with the chlorine gas ($Cl_2$) using as a mask the second resist pattern having the light shielding band pattern was performed, such that the light shielding film 4b (lower layer 41b and upper layer 42b) having the light shielding band pattern was formed (FIG. 3(g)). The etching bias in this dry etching was 50 W, which was a condition with the etching bias being significantly greater than the normal dry etching. Subsequently, the second resist pattern 6b was removed.

Next, the dry etching with the mixed gas of chlorine and oxygen (gas flow ratio of $Cl_2:O_2$=4:1) was conducted using as a mask the light shielding film 4b having the light shielding band pattern formed therein, such that the etching stopper film 3b having the light shielding band pattern was formed. After that, the predetermined cleaning process was conducted, and then, the transfer mask 200 was obtained (FIG. 3(h)).

[Evaluation of the Pattern Transfer Performance]

Using AIMS193 (manufactured by Carl Zeiss), a simulation of a transfer image in the exposure transfer to the resist film on a semiconductor device with the exposure light at the wavelength of 193 nm was performed on the fabricated transfer mask 200 of Example 1. As a result of inspection of the transfer image exposed in this simulation, there was no short or disconnection in patterns, which satisfied the design specification sufficiently. From this result, a circuit pattern finally formed on the semiconductor device may have great accuracy, even if the transfer mask of Example 1 is set on a mask stage of the exposure device to perform the exposure transfer to the resist film on the semiconductor device.

Example 2

The light semitransmissive film 2 was formed on the transparent substrate 1 by a procedure similar to Example 1. However, the film thickness of the light semitransmissive film 2 was 67 nm in Example 2. Next, the transparent substrate 1 with the light semitransmissive film 2 formed thereon was placed in a single-wafer RF sputtering device, a silicon dioxide ($SiO_2$) target was used, and the reactive sputtering (RF sputtering) in the mixed gas atmosphere of argon (Ar) and oxygen ($O_2$) was conducted, such that a $SiO_2$ film made of silicon and oxygen (etching stopper film 3), having a film thickness of 3 nm, was formed adjacent to the surface of the light semitransmissive film 2. For the laminated film of the MoSiN film (light semitransmissive film 2) and $SiO_2$ film (etching stopper film 3), the transmittance and phase difference at the wavelength of light of the ArF excimer laser (about 193 nm) were measured by the phase shift amount measuring device. As a result, the transmittance was 5.98%, and phase difference was 179.2 degrees.

Then, the transparent substrate 1 was placed in the single-wafer DC sputtering device, a tantalum (Ta) target was used, and the sputtering (DC sputtering) in the nitrogen ($N_2$) and xenon (Xe) gas atmosphere was conducted, such that the lower layer 41 of the light shielding film 4, made of tantalum and nitrogen (TaN film; Ta: 88.7 at %, N: 11.3 at %) and having the film thickness of 20 nm, was formed adjacent to the surface of the etching stopper film 3.

Next, the transparent substrate 1 was placed in the single-wafer DC sputtering device, the mixed target of tantalum (Ta) and hafnium (Hf) (Ta:Hf=80 at %:20 at %) was used, and the sputtering (DC sputtering) in the xenon (Xe) gas atmosphere was conducted, such that the upper layer 42 of the light shielding film 4, made of tantalum and hafnium (TaHf film; Ta: 86.4 at %, Hf: 13.5 at %) and having the film thickness of 10 nm, was formed adjacent to the surface of the lower layer 41. Further, the predetermined cleaning process was conducted, and then, the mask blank 100 of Example 2 was obtained.

[Manufacture of the Transfer Mask]

Then, the mask blank 100 of Example 1 was used to fabricate the transfer mask 200 of Example 2 through the following procedure. First, the first resist film 5 having the film thickness of 80 nm and made of the chemically amplified resist for electron beam drawing was formed adjacent to the surface of the light shielding film 4 (upper layer 42) through the spin coating method (FIG. 4(a)). Then, the light semitransmissive pattern to be formed in the light semitransmissive film 2, the transfer pattern of DRAM hp32 nm generation (the fine pattern including SRAF with the line width of 40 nm), was drawn with the electron beam on the first resist film 5, and the predetermined development and cleaning processes were conducted, such that the first resist film 5 (first resist pattern 5a) having the light semitransmissive pattern was formed (FIG. 4(b)). Next, the dry etching with the chlorine gas ($Cl_2$) using the first resist pattern 5a as a mask was performed, such that the light shielding film 4a (lower layer 41a and upper layer 42a) having the light semitransmissive pattern was formed. The etching bias in this dry etching was 15 W, which was a dry etching condition for the normal dry etching. Subsequently, the first resist pattern 5a was removed (FIG. 4(c)).

Then, the dry etching with the etching gas containing the fluorine-based gas ($SF_6$+He) was conducted using as a mask the light shielding film 4a (upper layer 42a) having the light semitransmissive pattern formed therein, such that the etching stopper film 3a and light semitransmissive film 2a having the light semitransmissive patterns respectively were formed (FIG. 4(d)).

Next, the second resist film having the film thickness of 80 nm and made of the chemically amplified resist for electron beam drawing was formed adjacent to the light shielding film 4a. Subsequently, the light shielding band pattern to be formed in the light shielding film 4 was drawn with the electron beam on the second resist film, and the predetermined development and cleaning processes were conducted, such that the resist film 6b (second resist pattern 6b) having the light shielding band pattern was formed (FIG. 4(e)). Next, the dry etching with the chlorine gas ($Cl_2$) using as a mask the second resist pattern having the light shielding band pattern was performed, such that the light shielding film 4b (lower layer 41b and upper layer 42b) having the light shielding band pattern was formed (FIG. 4(f)). The etching bias in this dry etching was 50 W in the patterning of the upper layer 42 and 15 W in the patterning of the lower layer 41. Subsequently, the second resist pattern 6b was removed. After that, the predetermined cleaning process was conducted, and then, the transfer mask 200 was obtained (FIG. 4(f)).

[Evaluation of the Pattern Transfer Performance]

Using AIMS193 (manufactured by Carl Zeiss), a simulation of the transfer image in the exposure transfer to the resist film on the semiconductor device with the exposure light at the wavelength of 193 nm was performed on the fabricated transfer mask 200 of Example 2. As a result of inspection of the transfer image exposed in this simulation, there was no short or disconnection in patterns, which satisfied the design specification sufficiently. From this result, the circuit pattern finally formed on the semiconductor device may have great accuracy, even if the transfer mask of Example 2 is set on the mask stage of the exposure device to perform the exposure transfer to the resist film on the semiconductor device.

Example 3

The light semitransmissive film 2, etching stopper film 3, and the lower layer 41 and upper layer 42 of the light shielding film 4 were formed on the transparent substrate 1 by a procedure similar to Example 2. Next, the transparent substrate 1 with the light semitransmissive film 2 and light shielding film 4 laminated thereon was placed in the single-wafer RF sputtering device, the silicon dioxide ($SiO_2$) target was used, and the reactive sputtering (RF sputtering) in the mixed gas atmosphere of argon (Ar) and oxygen ($O_2$) was conducted, such that the $SiO_2$ film made of silicon and oxygen (hard mask film 7), having the film thickness of 5 nm, was formed adjacent to the surface of the upper layer 42 of the light shielding film 4. Further, the predetermined cleaning process was carried out, and then, the mask blank 101 of Example 3 was obtained.

[Manufacture of the Transfer Mask]

Then, the mask blank 101 of Example 3 was used to fabricate the transfer mask 201 of Example 3 through the following procedure. First, the first resist film 5 having the film thickness of 80 nm and made of the chemically amplified resist for electron beam drawing was formed adjacent to the surface of the hard mask film 7 through the spin coating method (FIG. 5(a)). Then, the light semitransmissive pattern to be formed in the light semitransmissive film 2, the transfer pattern of DRAM hp32 nm generation (the fine pattern including SRAF with the line width of 40 nm), was drawn with the electron beam on the first resist film 5, and the predetermined development and cleaning processes were conducted, such that the first resist film 5 (first resist pattern 5a) having the light semitransmissive pattern was formed (FIG. 5(b)). Next, the dry etching with the fluorine-based gas ($CHF_3$) using the first resist pattern 5a as a mask was performed, such that the hard mask film 7a having the light semitransmissive pattern was formed (FIG. 5(b)).

Next, the dry etching with the chlorine gas ($Cl_2$) using as masks the first resist pattern 5a and the hard mask film 7a was performed, such that the light shielding film 4a (lower layer 41a and upper layer 42a) having the light semitransmissive pattern was formed. The etching bias in this dry etching was 15 W, which was the dry etching condition for the normal dry etching. Subsequently, the first resist pattern 5a was removed (FIG. 5(c)).

Then, the dry etching with the etching gas containing the fluorine-based gas ($SF_6$+He) was conducted using as a mask the light shielding film 4a (upper layer 42a) having the light semitransmissive pattern formed therein, such that the etching stopper film 3a and light semitransmissive film 2a having the light semitransmissive patterns were formed (FIG. 5(d)).

Next, the second resist film having the film thickness of 80 nm and made of the chemically amplified resist for electron beam drawing was formed adjacent to the light shielding film 4a. Subsequently, the light shielding band pattern to be formed in the light shielding film 4 was drawn with the electron beam on the second resist film, and the predetermined development and cleaning processes were conducted, such that the resist film 6b (second resist pattern 6b) having the light shielding band pattern was formed (FIG. 5(e)). Next, the dry etching with the chlorine gas ($Cl_2$) using as a mask the second resist pattern 6b having the light shielding band pattern was performed, such that the light shielding film 4b (lower layer 41b and upper layer 42b) having the light shielding band pattern was formed (FIG. 5(f)). The etching bias in this dry etching was 50 W in the patterning of both the upper layer 42 and lower layer 41. Subsequently, the second resist pattern 6b was removed. After that, the predetermined cleaning process was conducted, and then, the transfer mask 201 was obtained (FIG. 5(f)).

[Evaluation of the Pattern Transfer Performance]

Using AIMS193 (manufactured by Carl Zeiss), a simulation of the transfer image in the exposure transfer to the resist film on the semiconductor device with the exposure light at the wavelength of 193 nm was performed on the fabricated transfer mask 201 of Example 3. As a result of inspection of the transfer image exposed in this simulation, there was no short or disconnection in patterns, which satisfied the design specification sufficiently. From this result, the circuit pattern finally formed on the semiconductor device may have great accuracy, even if the transfer mask of Example 3 is set on the mask stage of the exposure device to perform the exposure transfer to the resist film on the semiconductor device.

Comparative Example 1

[Manufacture of the Mask Blank]

The mask blank was manufactured by a procedure similar to Example 1 except for the light shielding film 4 and etching stopper film 3. The mask blank of Comparative Example 1 was different from the mask blank 100 of Example 1 in that only a TaHf film made of tantalum and hafnium (Ta: 86.4 at %, Hf: 13.5 at %) and having the film thickness of 33 nm was formed as the light shielding film 4, and a CrOCN film made of chromium, oxygen, carbon, and nitrogen (Cr: 37 at %, O: 38 at %, C: 16 at %, N: 9 at %) and having the film thickness of 10 nm was formed as the etching stopper film 3.

[Manufacture of the Transfer Mask]

Then, the transfer mask of Comparative Example 1 was manufactured using the mask blank of Comparative Example 1 by a procedure similar to the procedure for manufacturing the transfer mask of Example 1.

[Evaluation of the Pattern Transfer Performance]

Using AIMS193 (manufactured by Carl Zeiss), a simulation of the transfer image in the exposure transfer to the resist film on the semiconductor device with the exposure light at the wavelength of 193 nm was performed on the fabricated transfer mask of Comparative Example 1. As a result of inspection of the transfer image exposed in this simulation, the shorts or disconnections in patterns were found at many points, and thus, the design specification was not satisfied. From this result, if the transfer mask of Comparative Example 1 is set on the mask stage of the exposure device to perform the exposure transfer to the resist film on the semiconductor device, the circuit pattern finally formed on the semiconductor device will not have great accuracy. Further, the transfer mask of Comparative Example 1 had the shorts and disconnections in patterns at many points, and thus, it was difficult to practically repair the defects by a mask defect repair device.

REFERENCE NUMERALS

1: transparent substrate
2: light semitransmissive film
2a: light semitransmissive film having the light semitransmissive pattern
3: etching stopper film
3a: etching stopper film having the light semitransmissive pattern
3b: etching stopper film having the light shielding band pattern
4: light shielding film
41: lower layer
42: upper layer
4a: light shielding film having the light semitransmissive pattern
4b: light shielding film having the light shielding band pattern
5, 6: resist film
5a: first resist pattern (resist film having the light semitransmissive pattern)
6b: second resist pattern (resist film having the light shielding band pattern)
7: hard mask film
7a: hard mask film having the light semitransmissive pattern
100, 101: mask blank
200, 201: transfer mask

What is claimed is:

1. A mask blank having a structure in which a light semitransmissive film and a light shielding film are laminated on a main surface of a transparent substrate,
   wherein the light semitransmissive film is formed from a material which can be dry etched with an etching gas containing a fluorine-based gas,
   wherein the light shielding film at least includes a laminated structure of a lower layer and an upper layer,
   wherein the lower layer is formed from a material containing tantalum and substantially free from hafnium, zirconium, and oxygen,
   wherein the upper layer is formed from a material containing tantalum and one or more elements selected from hafnium and zirconium, and free from oxygen excluding a surface layer thereof, and
   wherein an etching stopper film provided between the light semitransmissive film and the lower layer is made of a material having etch selectivity with respect to the lower layer in dry etching with an etching gas containing a chlorine-based gas and no oxygen gas.

2. The mask blank according to claim 1, wherein the upper layer is formed from a material which can be dry etched with the etching gas containing the chlorine-based gas and no oxygen gas and which has etch selectivity with respect to the light semitransmissive film in the dry etching with the etching gas containing the fluorine-based gas.

3. The mask blank according to claim 1, wherein the lower layer is formed from a material which can be dry etched with the etching gas containing the chlorine-based gas and no oxygen gas and which can be dry etched with the etching gas containing the fluorine-based gas.

4. The mask blank according to claim 1, wherein the lower layer is made of a nitrogen-containing material.

5. The mask blank according to claim 1, wherein the upper layer is made of a material not containing any non-metal element, except for its surface layer.

6. The mask blank according to claim 1, wherein the light semitransmissive film is made of a material containing silicon and nitrogen.

7. The mask blank according to claim 1, wherein the light shielding film comprises an uppermost layer in contact with a surface layer of the upper layer, and
   wherein the uppermost layer is formed from a material containing tantalum and substantially free from hafnium and zirconium.

8. The mask blank according to claim 7, wherein the uppermost layer is made of a nitrogen-containing material.

9. The mask blank according to claim 1, wherein a resist film made of an organic material is provided adjacent to a surface of the light shielding film.

10. The mask blank according to claim 1, wherein the lower layer has a thickness greater than a thickness of the upper layer.

11. The mask blank according to claim 1, wherein the etching stopper film is made of a chromium-containing material.

12. The mask blank according to claim 11, wherein the etching stopper film is formed from a material having an oxygen content of 20 at % or less.

13. The mask blank according to claim 11, wherein the etching stopper film is formed from a material having a chromium content of 55 at % or more.

14. The mask blank according to claim 11, wherein the etching stopper film has a thickness of 3 nm to 10 nm inclusive.

15. The mask blank according to claim 11, wherein in a laminated structure of the light semitransmissive film, the etching stopper film, and the light shielding film, optical density with respect to exposure light is 2.8 or more.

16. A method for manufacturing a transfer mask using the mask blank according to claim 11, comprising the steps of:
   forming a light semitransmissive pattern in the light shielding film by dry etching with an etching gas containing a chlorine-based gas and no oxygen gas, using as a mask a first resist film having a transfer pattern formed on the light shielding film;
   forming the light semitransmissive pattern in the etching stopper film by dry etching with an etching gas containing the chlorine-based gas and oxygen gas, using as a mask the light shielding film or the first resist film having the light semitransmissive pattern;
   forming the light semitransmissive pattern in the light semitransmissive film by dry etching with an etching gas containing a fluorine-based gas, using as a mask the etching stopper film or the light shielding film having the light semitransmissive pattern;
   forming a light shielding band pattern in the light shielding film by dry etching with an etching gas containing the chlorine-based gas and no oxygen gas, using as a mask a second resist film having the light shielding band pattern formed on the light shielding film; and
   forming the light shielding band pattern in the etching stopper film by dry etching with an etching gas containing the chlorine-based gas and oxygen gas, using as a mask the light shielding film or the second resist film having the light shielding band pattern formed on the light shielding film.

17. The method for manufacturing the transfer mask according to claim 16, wherein the dry etching for forming the light shielding band pattern at least in an upper layer of the light shielding film is performed in a high-bias state relative to the dry etching for forming the light semitransmissive pattern in the light shielding film.

18. The mask blank according to claim 1, wherein the etching stopper film is made of a material containing silicon and oxygen.

19. A transfer mask, wherein light semitransmissive patterns are formed in the light semitransmissive film and the etching stopper film of the mask blank according to claim 18, and a light shielding band pattern is formed in the light shielding film.

20. A method for manufacturing a transfer mask using the mask blank according to claim 18, comprising the steps of:

forming a light semitransmissive pattern in the light shielding film by dry etching with an etching gas containing the chlorine-based gas and no oxygen gas, using as a mask a first resist film having a transfer pattern formed on the light shielding film;

forming the light semitransmissive patterns in the etching stopper film and the light semitransmissive film by dry etching with an etching gas containing a fluorine-based gas, using as a mask the light shielding film or the first resist film having the light semitransmissive pattern; and forming a light shielding band pattern in the light shielding film by dry etching with an etching gas containing the chlorine-based gas and no oxygen gas, using as a mask a second resist film having the light shielding band pattern formed on the light shielding film.

21. A transfer mask, wherein a light semitransmissive pattern is formed in the light semitransmissive film of the mask blank according to claim 1, and light shielding band patterns are formed in the etching stopper film and the light shielding film.

* * * * *